US012744904B2

(12) United States Patent
Rezazadegan Tavakoli et al.

(10) Patent No.: US 12,744,904 B2
(45) Date of Patent: Sep. 22, 2026

(54) SYNTAX AND SEMANTICS FOR WEIGHT UPDATE COMPRESSION OF NEURAL NETWORKS

(71) Applicant: Nokia Technologies Oy, Espoo (FI)

(72) Inventors: Hamed Rezazadegan Tavakoli, Espoo (FI); Francesco Cricrì, Tampere (FI); Emre Baris Aksu, Tampere (FI); Miska Matias Hannuksela, Tampere (FI)

(73) Assignee: Nokia Technologies Oy, Espoo (FI)

( * ) Notice: Subject to any disclaimer, the term of this patent is extended or adjusted under 35 U.S.C. 154(b) by 180 days.

(21) Appl. No.: 18/555,646

(22) PCT Filed: Apr. 7, 2022

(86) PCT No.: PCT/IB2022/053294

§ 371 (c)(1),
(2) Date: Oct. 16, 2023

(87) PCT Pub. No.: WO2022/224069

PCT Pub. Date: Oct. 27, 2022

(65) Prior Publication Data

US 2024/0195969 A1 Jun. 13, 2024

Related U.S. Application Data

(60) Provisional application No. 63/178,424, filed on Apr. 22, 2021.

(51) Int. Cl.
*H04N 19/124* (2014.01)
*G06N 3/063* (2023.01)
(Continued)

(52) U.S. Cl.
CPC .......... *H04N 19/124* (2014.11); *G06N 3/063* (2013.01); *H03M 7/3066* (2013.01);
(Continued)

(58) Field of Classification Search
CPC ...... H04N 19/124; H04N 19/70; G06N 3/063; H03M 7/3066; H03M 7/4075; H03M 7/46
(Continued)

(56) References Cited

U.S. PATENT DOCUMENTS 11,496,151 B1 * 11/2022 Wang .................... G06N 3/045
2019/0347522 A1 * 11/2019 Nir ...................... G06V 40/173
(Continued)

FOREIGN PATENT DOCUMENTS

EP 3716158 A2 9/2020
WO 2020/014590 A1 1/2020

OTHER PUBLICATIONS

Office action received for corresponding Indian Patent Application No. 202347073016, dated Jul. 2, 2024, 9 pages.
(Continued)

*Primary Examiner* — Allen C Wong
(74) *Attorney, Agent, or Firm* — McCarter & English, LLP; Joseph C. Drish

(57) ABSTRACT

An example apparatus, method, and computer program product are provided. The apparatus includes at least one processor; and at least one non-transitory memory including computer program code; wherein the at least one memory and the computer program code are configured to, with the at least one processor, cause the apparatus at least to perform: encode or decode a high-level bitstream syntax for at least one neural network; wherein the high-level bitstream syntax comprises at least one information unit, wherein the at least one information unit comprises syntax definitions for the at least one neural network or a portion of the at least one neural network; and wherein a neural network representation (NNR) bitstream comprises one or more of the at least one information units, and wherein the syntax definitions pro-
(Continued)

vide one or more mechanisms for introducing a weight update compression interpretation into the NNR bitstream.

19 Claims, 9 Drawing Sheets

(51) Int. Cl.
*H03M 7/30* (2006.01)
*H03M 7/40* (2006.01)
*H03M 7/46* (2006.01)
*H04N 19/70* (2014.01)

(52) U.S. Cl.
CPC ........... *H03M 7/4075* (2013.01); *H03M 7/46* (2013.01); *H04N 19/70* (2014.11)

(58) Field of Classification Search
USPC ..................................................... 375/240.03
See application file for complete search history.

(56) References Cited

U.S. PATENT DOCUMENTS

| | | | | |
|---|---|---|---|---|
| 2020/0404572 | A1* | 12/2020 | Siddalinga | H04L 61/58 |
| 2021/0295137 | A1* | 9/2021 | Thakker | G06F 12/0646 |

OTHER PUBLICATIONS

"Information technology—Multimedia content description interface—Part 17: Compression of neural networks for multimedia content description and analysis", ISO 15938-17, 2022, 83 pages.
"Information Technology—Generic Coding of Moving Pictures and Associated Audio Information: Systems", Series H: Audiovisual and Multimedia Systems, Infrastructure of Audiovisual Services—Transmission Multiplexing and Synchronization, Recommendation ITU-T H.222.0, Mar. 2017, 291 pages.
"Information technology—Generic coding of moving pictures and associated audio information: Video", Series H: Audiovisual and Multimedia Systems Infrastructure of audiovisual services—Coding of moving video, ITU-T Recommendation H.262, Feb. 2000, 220 pages.
"Information technology—Universal coded character set (UCS)", ISO/IEC 10646, Sixth edition, Dec. 2020, 9 pages.
"IEEE 802.11", Wikipedia, Retrieved on Dec. 1, 2023, Webpage available at : https://en.wikipedia.org/wiki/IEEE_802.11.
"Information Technology—Coding of Audio-Visual Objects—Part 12: ISO Base Media File Format", ISO/IEC 14496-12, Fifth edition, Dec. 15, 2015, 248 pages.
"Information Technology—Coding of Audio-Visual Objects—Part 15: Advanced Video Coding (AVC) File Format", ISO/IEC 14496-15, First edition, Apr. 15, 2004, 29 pages.
"Video Coding for Low Bit Rate Communication", Series H: Audiovisual and Multimedia Systems, Infrastructure of audiovisual services—Coding of moving Video, ITU-T Recommendation H.263, Jan. 2005, 226 pages.
"Advanced Video Coding for Generic Audiovisual services", Series H: Audiovisual and Multimedia Systems, Infrastructure of audiovisual services—Coding of moving Video, Recommendation ITU-T H.264, Apr. 2017, 812 pages.
Invitation to Pay Additional Fees received for corresponding Patent Cooperation Treaty Application No. PCT/IB2022/053294, dated Jul. 7, 2022, 15 pages.
Wiedemann et al., "DeepCABAC: A Universal Compression Algorithm for Deep Neural Networks", IEEE Journal of Selected Topics in Signal Processing, vol. 14, No. 4, May 2020, pp. 700-714.
Cricri et al., "[NNR] Extensions to the high-level bitstream syntax for compressed neural network representations", Nokia, ISO/IEC JTC1/SC29/WG11 MPEG2020/ m53719, Apr. 2020, 8 pages.
Afrabandpay et al., "[NNR] Response to MPEG call for proposals on incremental weight update compression", Nokia, ISO/IEC JTC 1/SC 29/WG 2, m56604, Apr. 2021, 30 pages.
International Search Report and Written Opinion received for corresponding Patent Cooperation Treaty Application No. PCT/IB2022/053294, dated Aug. 29, 2022, 21 pages.

* cited by examiner

Figure 9:
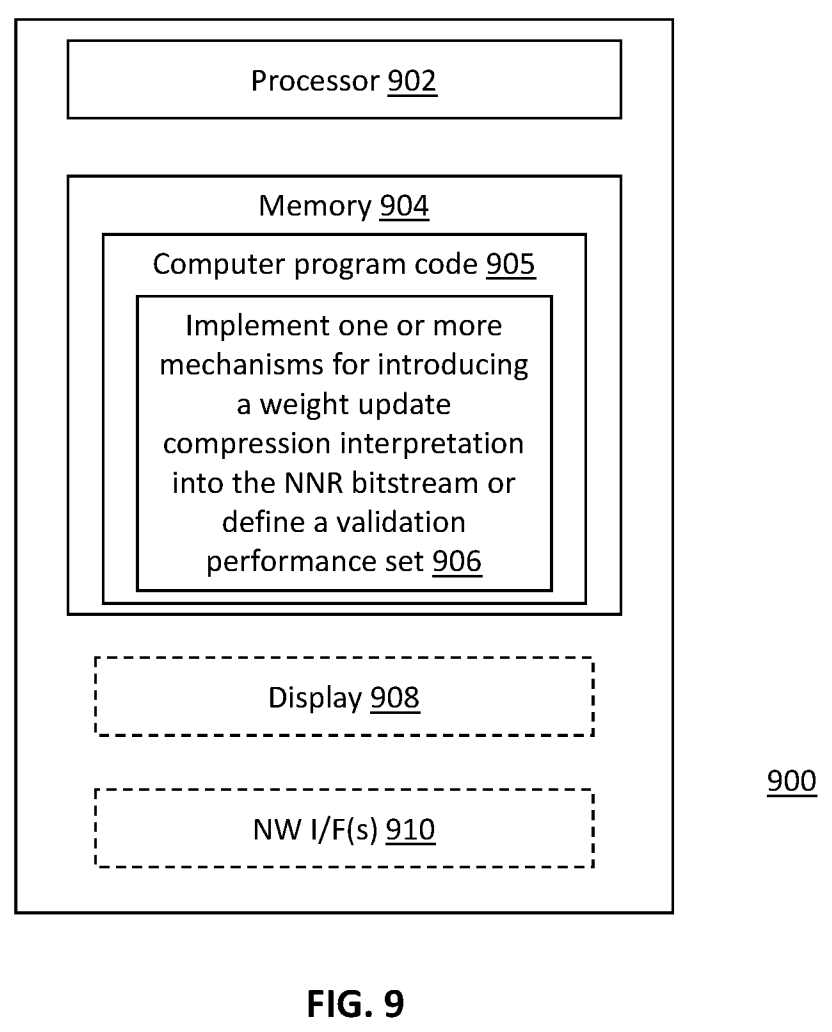

900

Processor 902

Memory 904

Computer program code 905

Implement one or more mechanisms for introducing a weight update compression interpretation into the NNR bitstream or define a validation performance set 906

Display 908

SYNTAX AND SEMANTICS FOR WEIGHT UPDATE COMPRESSION OF NEURAL NETWORKS

RELATED APPLICATION

This application claims priority to PCT Application No. PCT/IB2022/053294, filed on Apr. 7, 2022, which claims priority to U.S. Provisional Application No. 63/178,424, filed on Apr. 22, 2021, each of which is incorporated herein by reference in its entirety.

TECHNICAL FIELD

The examples and non-limiting embodiments relate generally to multimedia transport and neural networks, and more particularly, to syntax and semantics for incremental weight update compression of neural networks.

BACKGROUND

It is known to provide standardized formats for exchange of neural networks.

SUMMARY

An example apparatus includes at least one processor; and at least one non-transitory memory including computer program code; wherein the at least one memory and the computer program code are configured to, with the at least one processor, cause the apparatus at least to perform: encode or decode a high-level bitstream syntax for at least one neural network; wherein the high-level bitstream syntax comprises at least one information unit, wherein the at least one information unit comprises syntax definitions for the at least one neural network or a portion of the at least one neural network; and wherein a neural network representation (NNR) bitstream comprises one or more of the at least one information units; and wherein the syntax definitions provide one or more mechanisms for introducing a weight update compression interpretation into the NNR bitstream.

The example apparatus may further include, wherein the one or more mechanisms comprise at least one of: a mechanism to signal an incremental weight update compression mode of operation; a mechanism to introduce a weight update unit type among the at least one information unit; a mechanism to signal mechanisms required for dithering algorithms; a mechanism to signal a global random seed; a mechanism to signal whether a model comprises an inference friendly quantized model; a mechanism to signal incremental weight update quantization algorithms; a mechanism to signal federated averaging weight update algorithm; a mechanism to signal supporting down-stream compression support; a mechanism to signal an asynchronous incremental weight update mode; a mechanism to identify a source of information; a mechanism to identify an operation; a mechanism to define global codebook approaches for a weight update quantization; a mechanism to define extension to one or more data payload types; a mechanism to define extension to a payload; a mechanism to define a syntax and semantics of one or more quantization algorithms; a mechanism to identify encoding and decoding procedures of bitmask applicable to quantization algorithm outputs; or a mechanism to identify a syntax and semantics relevant to a topology change.

The example apparatus may further include, wherein the mechanism to signal the incremental weight update compression mode of operation comprises an incremental weight update flag to signal or indicates to a decoder that the NNR bitstream is associated with or corresponds to a weight update compression and not a weight compression.

The example apparatus may further include, wherein the incremental weight update flag further signals or indicates to the decoder to invoke an associated decoding mechanism upon receiving a data and decode an associated payload types.

The example apparatus may further include, wherein the mechanism to introduce the weight update unit type among the at least one information unit comprises a weight update compression data unit type comprising information associated with weight update strategies.

The example apparatus may further include, wherein the at least one information unit comprises at least one NNR unit type.

The example apparatus may further include, wherein the mechanism to signal dithering algorithms comprises a dithering flag to support dithering techniques in quantization and encoding pipelines.

The example apparatus may further include, wherein the one or more information unit comprises a global random seed used for encoding and decoding computation, when the dithering flag is set.

The example apparatus may further include, wherein the mechanism to signal a global random seed comprises a random seed flag, comprising a global random seed, to be a part of the one or more information unit.

The example apparatus may further include, wherein the mechanism to signal whether a model comprises an inference friendly quantized model comprises an inference friendly flag.

The example apparatus may further include, wherein the mechanism to signal incremental weight update quantization algorithms comprises a quantized weight update flag to indicate whether the weight updates are quantized or not.

The example apparatus may further include, wherein the mechanism to signal incremental weight update quantization algorithms comprises a quantization algorithm identity to indicate that no quantization algorithm was applied to the weight updates.

The example apparatus may further include, wherein the mechanism to the signal federated averaging weight update algorithm comprises signaling a predetermined federated algorithm identity.

The example apparatus may further include, wherein the mechanism to signal supporting down-stream compression support comprises downstream flag to indicate whether a downstream compression is used, and wherein the downstream refers to the communication direction from a server to one or more client devices.

The example apparatus may further include, wherein the mechanism to signal an asynchronous incremental weight update mode comprises an asynchronous flag to indicate whether a client device is permitted to perform an asynchronous operation, based on the capabilities of the client device.

The example apparatus may further include, wherein the mechanism to a identify the source of information comprises a source identity, wherein the source comprises at least one of a client device or a server.

The example apparatus may further include, wherein the mechanism identify an operation identity comprises used for communication of a specific information.

The example apparatus may further include, wherein the mechanism to define the extension to the one or more data payload types comprises adding an incremental weight update type to a compressed payload data types.

The example apparatus may further include, wherein the mechanism to define the extension to the payload comprises defining an incremental weight update payload comprising semantics and encoded bitstream of predetermined algorithm.

The example apparatus may further include, wherein the mechanism to define the syntax and semantics of one or more quantization algorithms comprises using a sign stochastic gradient descent (sgd) quantization to generate a bitmask indicating changes in the weight update compression.

The example apparatus may further include, wherein a payload for the sign sgd quantization comprises a sign sgd quantization payload.

The example apparatus may further include, wherein the mechanism to identify encoding and decoding procedures of bitmask applicable to quantization algorithm outputs comprises a run-length encoding or decoding mechanism, a position or length encoding or decoding mechanism, or a golomb encoding/decoding mechanism.

The example apparatus may further include, wherein the mechanism to a mechanism to identify a syntax and semantics associated with topology change comprises using a topology container to signal changes in a topology, when an incremental weight update flag is set.

The example apparatus may further include, wherein the mechanism to a mechanism to identify a syntax and semantics associated with topology change comprises a topology weight update container for storing a topology format to indicate a topology update associated with a weight update.

The example apparatus may further include, wherein a required payload and decoding procedures are invoked when the topology weight update container is present in a topology unit payload.

The example apparatus may further include, wherein a required payload comprises one or more of: a number element identity comprising a number of elements for which a topology modification is signaled; an element identity comprising an array of identifiers, wherein each identifier is associated with an element that is modified due the topology update; a weight tensor dimension comprising a list comprising one or more lists, wherein each list of the one or more list comprises updated dimensions of a weight vector associated with the element identity; a reorganize flag to indicate whether an existing weight vector is reorganized according to the updated dimensions or an associated weight vector, wherein when the reorganize flag signals a reorganization the payload contains a mapping to indicate how an updated weight tensor is obtained from an existing weight tensor; a weight mapping indicates how an existing weight is mapped to an updated topology element; or topology compressed is used to indicate whether information associated with the topology update is capable of being compressed or follows a specific encoding and decoding procedure to be invoked in order to decode the topology information.

An example method includes encoding or decoding a high-level bitstream syntax for at least one neural network; wherein the high-level bitstream syntax comprises at least one information unit, wherein the at least one information unit comprises syntax definitions for the at least one neural network or a portion of the at least one neural network; wherein a neural network representation (NNR) bitstream comprises one or more of the at least one information units; and wherein the syntax definitions provide one or more mechanisms for introducing a weight update compression interpretation into the NNR bitstream.

The example method may further include, wherein the one or more mechanisms comprise at least one of: a mechanism to signal an incremental weight update compression mode of operation; a mechanism to introduce a weight update unit type among the at least one information unit; a mechanism to signal mechanisms required for dithering algorithms; a mechanism to signal a global random seed; a mechanism to signal whether a model comprises an inference friendly quantized model; a mechanism to signal incremental weight update quantization algorithms; a mechanism to signal federated averaging weight update algorithm; a mechanism to signal supporting down-stream compression support; a mechanism to signal an asynchronous incremental weight update mode; a mechanism to identify a source of information; a mechanism to identify an operation; a mechanism to define global codebook approaches for a weight update quantization; a mechanism to define extension to one or more data payload types; a mechanism to define extension to a payload; a mechanism to define a syntax and semantics of one or more quantization algorithms; a mechanism to identify encoding and decoding procedures of bitmask applicable to quantization algorithm outputs; or a mechanism to identify a syntax and semantics relevant to a topology change.

The example method may further include, wherein the mechanism to signal the incremental weight update compression mode of operation comprises an incremental weight update flag to signal or indicates to a decoder that the NNR bitstream is associated with or corresponds to a weight update compression and not a weight compression.

The example method may further include, wherein the incremental weight update flag further signals or indicates to the decoder to invoke an associated decoding mechanism upon receiving a data and decode an associated payload types.

The example method may further include, wherein the mechanism to introduce the weight update unit type among the at least one information unit comprises a weight update compression data unit type comprising information associated with weight update strategies.

The example method may further include, wherein the at least one information unit includes at least one NNR unit type.

The example method may further include, wherein the mechanism to signal dithering algorithms comprises a dithering flag to support dithering techniques in quantization and encoding pipelines.

The example method may further include, wherein the one or more information unit comprises a global random seed used for encoding and decoding computation, when the dithering flag is set.

The example method may further include, wherein the mechanism to signal a global random seed comprises a random seed flag, comprising a global random seed, to be a part of the one or more information unit.

The example method may further include, wherein the mechanism to signal whether a model comprises an inference friendly quantized model comprises an inference friendly flag.

The example method may further include, wherein the mechanism to signal incremental weight update quantization algorithms comprises a quantized weight update flag to indicate whether the weight updates are quantized or not.

The example method may further include, wherein the mechanism to signal incremental weight update quantization algorithms comprises a quantization algorithm identity to indicate that no quantization algorithm was applied to the weight updates.

The example method may further include, wherein the mechanism to the signal federated averaging weight update algorithm comprises signaling a predetermined federated algorithm identity.

The example method may further include, wherein the mechanism to signal supporting down-stream compression support comprises downstream flag to indicate whether a downstream compression is used, and wherein the downstream refers to the communication direction from a server to one or more client devices.

The example method may further include, wherein the mechanism to signal an asynchronous incremental weight update mode comprises an asynchronous flag to indicate whether a client device is permitted to perform an asynchronous operation, based on the capabilities of the client device.

The example method may further include, wherein the mechanism to a identify the source of information comprises a source identity, wherein the source comprises at least one of a client device or a server.

The example method may further include, wherein the mechanism identify an operation identity comprises used for communication of a specific information.

The example method may further include, wherein the mechanism to define the extension to the one or more data payload types comprises adding an incremental weight update type to a compressed payload data types.

The example method may further include, wherein the mechanism to define the extension to the payload comprises defining an incremental weight update payload comprising semantics and encoded bitstream of predetermined algorithm.

The example method may further include, wherein the mechanism to define the syntax and semantics of one or more quantization algorithms comprises using a sign stochastic gradient descent (sgd) quantization to generate a bitmask indicating changes in the weight update compression.

The example method may further include, wherein a payload for the sign sgd quantization comprises a sign sgd quantization payload.

The example method may further include, wherein the mechanism to identify encoding and decoding procedures of bitmask applicable to quantization algorithm outputs comprises a run-length encoding or decoding mechanism, a position or length encoding or decoding mechanism, or a golomb encoding/decoding mechanism.

The example method may further include, wherein the mechanism to a mechanism to identify a syntax and semantics associated with topology change comprises using a topology container to signal changes in a topology, when an incremental weight update flag is set.

The example method may further include, wherein the mechanism to a mechanism to identify a syntax and semantics associated with topology change comprises a topology weight update container for storing a topology format to indicate a topology update associated with a weight update.

The example method may further include, wherein a required payload and decoding procedures are invoked when the topology weight update container is present in a topology unit payload.

The example method may further include, wherein a required payload comprises one or more of: a number element identity comprising a number of elements for which a topology modification is signaled; an element identity comprising an array of identifiers, wherein each identifier is associated with an element that is modified due the topology update; a weight tensor dimension comprising a list comprising one or more lists, wherein each list of the one or more list comprises updated dimensions of a weight vector associated with the element identity; a reorganize flag to indicate whether an existing weight vector is reorganized according to the updated dimensions or an associated weight vector, wherein when the reorganize flag signals a reorganization the payload contains a mapping to indicate how an updated weight tensor is obtained from an existing weight tensor; a weight mapping indicates how an existing weight is mapped to an updated topology element; or topology compressed is used to indicate whether information associated with the topology update is capable of being compressed or follows a specific encoding and decoding procedure to be invoked in order to decode the topology information.

An example computer readable medium includes program instructions for causing an apparatus to perform at least the following: encoding or decoding a high-level bitstream syntax for at least one neural network; wherein the high-level bitstream syntax comprises at least one information unit, wherein the at least one information unit comprises syntax definitions for the at least one neural network or a portion of the at least one neural network; wherein a neural network representation (NNR) bitstream comprises one or more of the at least one information units; and wherein the syntax definitions provide one or more mechanisms for introducing a weight update compression interpretation into the NNR bitstream.

The example computer readable medium may further include, wherein the computer readable medium comprises a non-transitory computer readable medium.

The example computer readable medium may further include, wherein the computer readable medium further causes the apparatus to perform the methods as described in any of the claims previous paragraphs.

BRIEF DESCRIPTION OF THE DRAWINGS

The foregoing aspects and other features are explained in the following description, taken in connection with the accompanying drawings, wherein:

FIG. 9 is an example apparatus configured to implement one or more mechanisms for introducing a weight update compression interpretation into the NNR bitstream, in accordance with an embodiment.

DETAILED DESCRIPTION OF EXAMPLE EMBODIMENTS

Figure 2:
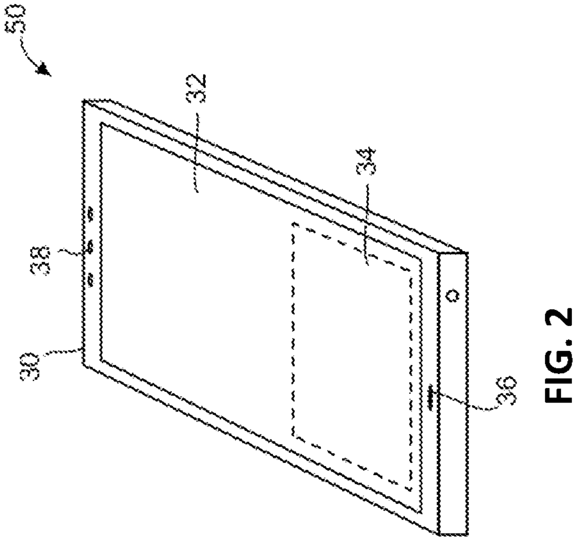
FIG. 2 shows schematically a user equipment suitable for employing embodiments of the examples described herein.

The following acronyms and abbreviations that may be found in the specification and/or the drawing figures are defined as follows:

3GP 3GPP file format
3GPP 3rd Generation Partnership Project
3GPP TS 3GPP technical specification
4CC four character code
4G fourth generation of broadband cellular network technology
5G fifth generation cellular network technology
5GC 5G core network
ACC accuracy
AI artificial intelligence
AIoT AI-enabled IoT
a.k.a. also known as
AMF access and mobility management function
AVC advanced video coding
CABAC context-adaptive binary arithmetic coding
CDMA code-division multiple access
CE core experiment
CU central unit
DASH dynamic adaptive streaming over HTTP
DCT discrete cosine transform
DSP digital signal processor
DU distributed unit
eNB (or eNodeB) evolved Node B (for example, an LTE base station)
EN-DC E-UTRA-NR dual connectivity
en-gNB or En-gNB node providing NR user plane and control plane protocol terminations towards the UE, and acting as secondary node in EN-DC
E-UTRA evolved universal terrestrial radio access, for example, the LTE radio access technology
FDMA frequency division multiple access
f(n) fixed-pattern bit string using n bits written (from left to right) with the left bit first.
F1 or F1-C interface between CU and DU control interface
gNB (or gNodeB) base station for 5G/NR, for example, a node providing NR user plane and control plane protocol terminations towards the UE, and connected via the NG interface to the 5GC
GSM Global System for Mobile communications
H.222.0 MPEG-2 Systems is formally known as ISO/IEC 13818-1 and as ITU-T Rec. H.222.0
H.26x family of video coding standards in the domain of the ITU-T
HLS high level syntax
IBC intra block copy
ID identifier
IEC International Electrotechnical Commission
IEEE Institute of Electrical and Electronics Engineers
I/F interface
IMD integrated messaging device
IMS instant messaging service
IoT internet of things
IP internet protocol
ISO International Organization for Standardization
ISOBMFF ISO base media file format
ITU International Telecommunication Union
ITU-T ITU Telecommunication Standardization Sector
JPEG joint photographic experts group
LTE long-term evolution
LZMA Lempel-Ziv-Markov chain compression
LZMA2 simple container format that can include both uncompressed data and LZMA data
LZO Lempel-Ziv-Oberhumer compression
LZW Lempel-Ziv-Welch compression
MAC medium access control
mdat MediaDataBox
MME mobility management entity
MMS multimedia messaging service
moov MovieBox
MP4 file format for MPEG-4 Part 14 files
MPEG moving picture experts group
MPEG-2 H.222/H.262 as defined by the ITU
MPEG-4 audio and video coding standard for ISO/IEC 14496
MSB most significant bit
NAL network abstraction layer
NDU NN compressed data unit
ng or NG new generation
ng-eNB or NG-eNB new generation eNB
NN neural network
NNEF neural network exchange format
NNR neural network representation
NR new radio (5G radio)
N/W or NW network
ONNX Open Neural Network eXchange
PB protocol buffers
PC personal computer
PDA personal digital assistant
PDCP packet data convergence protocol
PHY physical layer
PID packet identifier
PLC power line communication
PNG portable network graphics
PSNR peak signal-to-noise ratio
RAM random access memory
RAN radio access network
RFC request for comments
RFID radio frequency identification
RLC radio link control
RRC radio resource control
RRH remote radio head
RU radio unit
Rx receiver
SDAP service data adaptation protocol
sgd sign stochastic gradient descent
SGW serving gateway
SMF session management function
SMS short messaging service
st(v) null-terminated string encoded as UTF-8 characters as specified in ISO/IEC 10646
SVC scalable video coding
S1 interface between eNodeBs and the EPC
TCP-IP transmission control protocol-internet protocol
TDMA time divisional multiple access
trak TrackBox
TS transport stream
TUC technology under consideration TV television
Tx transmitter
UE user equipment
ue(v) unsigned integer Exp-Golomb-coded syntax element with the left bit first
UICC Universal Integrated Circuit Card
UMTS Universal Mobile Telecommunications System
u(n) unsigned integer using n bits
UPF user plane function
URI uniform resource identifier
URL uniform resource locator
UTF-8 8-bit Unicode Transformation Format
WLAN wireless local area network
X2 interconnecting interface between two eNodeBs in LTE network
Xn interface between two NG-RAN nodes Some embodiments will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms 'data,' 'content,' 'information,' and similar terms may be used interchangeably to refer to data capable of being transmitted, received and/or stored in accordance with embodiments of the present invention. Thus, use of any such terms should not be taken to limit the spirit and scope of embodiments of the present invention.

Additionally, as used herein, the term 'circuitry' refers to (a) hardware-only circuit implementations (e.g., implementations in analog circuitry and/or digital circuitry); (b) combinations of circuits and computer program product(s) comprising software and/or firmware instructions stored on one or more computer readable memories that work together to cause an apparatus to perform one or more functions described herein; and (c) circuits, such as, for example, a microprocessor(s) or a portion of a microprocessor(s), that require software or firmware for operation even if the software or firmware is not physically present. This definition of 'circuitry' applies to all uses of this term herein, including in any claims. As a further example, as used herein, the term 'circuitry' also includes an implementation comprising one or more processors and/or portion(s) thereof and accompanying software and/or firmware. As another example, the term 'circuitry' as used herein also includes, for example, a baseband integrated circuit or applications processor integrated circuit for a mobile phone or a similar integrated circuit in a server, a cellular network device, other network device, and/or other computing device.

As defined herein, a 'computer-readable storage medium,' which refers to a non-transitory physical storage medium (e.g., volatile or non-volatile memory device), can be differentiated from a 'computer-readable transmission medium,' which refers to an electromagnetic signal.

A method, apparatus and computer program product are provided in accordance with an example embodiment in order to implement one or more mechanisms for introducing a weight update compression interpretation into the neural network representation (NNR) bitstream.

Figure 1:
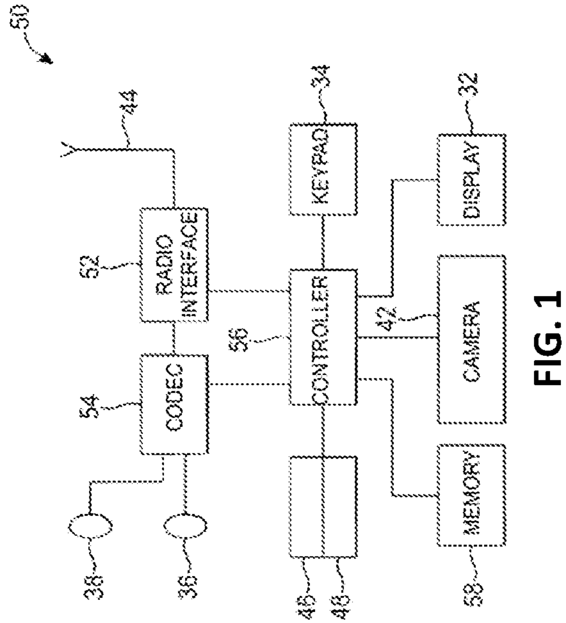
FIG. 1 shows schematically an electronic device employing embodiments of the examples described herein.

The following describes in detail suitable apparatus and possible implementation of one or more mechanisms for introducing a weight update compression interpretation into the neural network representation (NNR) bitstream. In this regard reference is first made to FIG. 1 and FIG. 2, where FIG. 1 shows an example block diagram of an apparatus 50. The apparatus may be an Internet of Things (IoT) apparatus configured to perform various functions, for example, gathering information by one or more sensors, receiving or transmitting information, analyzing information gathered or received by the apparatus, or the like. The apparatus may comprise a video coding system, which may incorporate a codec. FIG. 2 shows a layout of an apparatus according to an example embodiment. The elements of FIG. 1 and FIG. 2 will be explained next.

The electronic device 50 may for example be a mobile terminal or user equipment of a wireless communication system, a sensor device, a tag, or a lower power device. However, it would be appreciated that embodiments of the examples described herein may be implemented within any electronic device or apparatus which may process data by neural networks.

The apparatus 50 may comprise a housing 30 for incorporating and protecting the device. The apparatus 50 may further comprise a display 32, e.g., in the form of a liquid crystal display, light emitting diode display, organic light emitting diode display, and the like. In other embodiments of the examples described herein the display may be any suitable display technology suitable to display media or multimedia content, for example, an image or a video. The apparatus 50 may further comprise a keypad 34. In other embodiments of the examples described herein any suitable data or user interface mechanism may be employed. For example, the user interface may be implemented as a virtual keyboard or data entry system as part of a touch-sensitive display.

The apparatus may comprise a microphone 36 or any suitable audio input which may be a digital or analogue signal input. The apparatus 50 may further comprise an audio output device which in embodiments of the examples described herein may be any one of: an earpiece 38, speaker, or an analogue audio or digital audio output connection. The apparatus 50 may also comprise a battery (or in other embodiments of the examples described herein the device may be powered by any suitable mobile energy device such as solar cell, fuel cell or clockwork generator). The apparatus may further comprise a camera capable of recording or capturing images and/or video. The apparatus 50 may further comprise an infrared port for short range line of sight communication to other devices. In other embodiments the apparatus 50 may further comprise any suitable short range communication solution such as for example a Bluetooth wireless connection or a USB/firewire wired connection.

The apparatus 50 may comprise a controller 56, a processor or processor circuitry for controlling the apparatus 50. The controller 56 may be connected to a memory 58 which in embodiments of the examples described herein may store both data in the form of image, audio data, video data and/or may also store instructions for implementation on the controller 56. The controller 56 may further be connected to codec circuitry 54 suitable for carrying out coding and/or decoding of audio, image, and/or video data or assisting in coding and/or decoding carried out by the controller.

The apparatus 50 may further comprise a card reader 48 and a smart card 46, for example a UICC and UICC reader for providing user information and being suitable for providing authentication information for authentication and authorization of the user at a network.

The apparatus 50 may comprise radio interface circuitry 52 connected to the controller and suitable for generating wireless communication signals, for example, for communication with a cellular communications network, a wireless communications system or a wireless local area network. The apparatus 50 may further comprise an antenna 44 connected to the radio interface circuitry 52 for transmitting radio frequency signals generated at the radio interface circuitry 52 to other apparatus(es) and/or for receiving radio frequency signals from other apparatus(es).

The apparatus 50 may comprise a camera 42 capable of recording or detecting individual frames which are then passed to the codec 54 or the controller for processing. The apparatus may receive the video image data for processing from another device prior to transmission and/or storage. The apparatus 50 may also receive either wirelessly or by a wired connection the image for coding/decoding. The structural elements of apparatus 50 described above represent examples of means for performing a corresponding function.

Figures 3, 4:
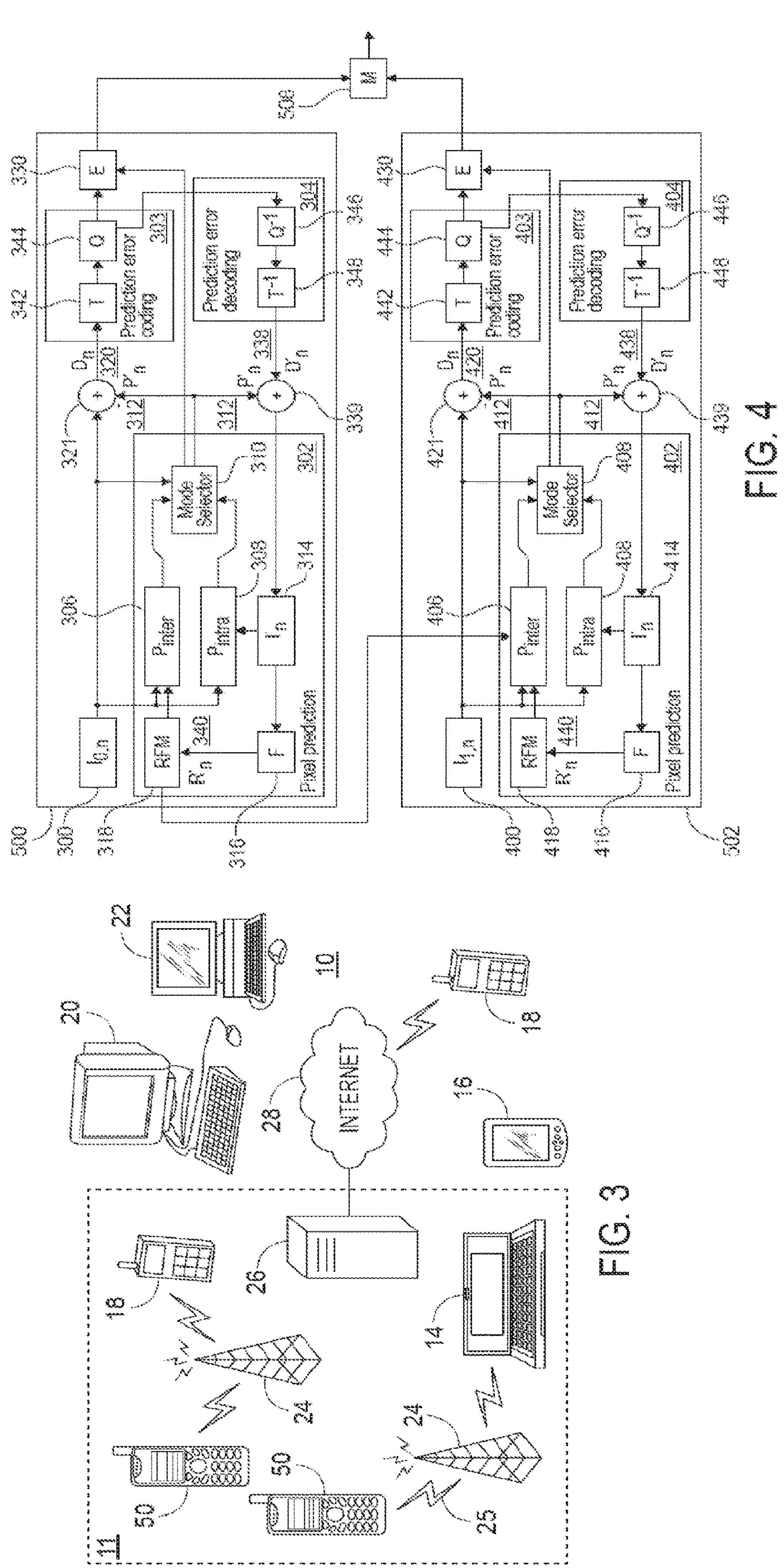
FIG. 3 further shows schematically electronic devices employing embodiments of the examples described herein connected using wireless and wired network connections.
FIG. 4 shows schematically a block chart of an encoder on a general level.

With respect to FIG. 3, an example of a system within which embodiments of the examples described herein can be utilized is shown. The system 10 comprises multiple communication devices which can communicate through one or more networks. The system 10 may comprise any combination of wired or wireless networks including, but not limited to a wireless cellular telephone network (such as a GSM, UMTS, CDMA, LTE, 4G, 5G network, and the like), a wireless local area network (WLAN) such as defined by any of the IEEE 802.x standards, a Bluetooth® personal area network, an Ethernet local area network, a token ring local area network, a wide area network, and the Internet.

The system 10 may include both wired and wireless communication devices and/or apparatus 50 suitable for implementing embodiments of the examples described herein.

For example, the system shown in FIG. 3 shows a mobile telephone network 11 and a representation of the Internet 28. Connectivity to the Internet 28 may include, but is not limited to, long range wireless connections, short range wireless connections, and various wired connections including, but not limited to, telephone lines, cable lines, power lines, and similar communication pathways.

The example communication devices shown in the system 10 may include, but are not limited to, an electronic device or apparatus 50, a combination of a personal digital assistant (PDA) and a mobile telephone 14, a PDA 16, an integrated messaging device (IMD) 18, a desktop computer 20, a notebook computer 22. The apparatus 50 may be stationary or mobile when carried by an individual who is moving. The apparatus 50 may also be located in a mode of transport including, but not limited to, a car, a truck, a taxi, a bus, a train, a boat, an airplane, a bicycle, a motorcycle or any similar suitable mode of transport.

The embodiments may also be implemented in a set-top box; for example, a digital TV receiver, which may/may not have a display or wireless capabilities, in tablets or (laptop) personal computers (PC), which have hardware and/or software to process neural network data, in various operating systems, and in chipsets, processors, DSPs and/or embedded systems offering hardware/software based coding.

Some or further apparatus may send and receive calls and messages and communicate with service providers through a wireless connection 25 to a base station 24. The base station 24 may be connected to a network server 26 that allows communication between the mobile telephone network 11 and the internet 28. The system may include additional communication devices and communication devices of various types.

The communication devices may communicate using various transmission technologies including, but not limited to, code division multiple access (CDMA), global systems for mobile communications (GSM), universal mobile telecommunications system (UMTS), time divisional multiple access (TDMA), frequency division multiple access (FDMA), transmission control protocol-internet protocol (TCP-IP), short messaging service (SMS), multimedia messaging service (MMS), email, instant messaging service (IMS), Bluetooth, IEEE 802.11, 3GPP Narrowband IoT and any similar wireless communication technology. A communications device involved in implementing various embodiments of the examples described herein may communicate using various media including, but not limited to, radio, infrared, laser, cable connections, and any suitable connection.

In telecommunications and data networks, a channel may refer either to a physical channel or to a logical channel. A physical channel may refer to a physical transmission medium such as a wire, whereas a logical channel may refer to a logical connection over a multiplexed medium, capable of conveying several logical channels. A channel may be used for conveying an information signal, for example a bitstream, from one or several senders (or transmitters) to one or several receivers.

The embodiments may also be implemented in so-called internet of things (IoT) devices. The IoT may be defined, for example, as an interconnection of uniquely identifiable embedded computing devices within the existing Internet infrastructure. The convergence of various technologies has and may enable many fields of embedded systems, such as wireless sensor networks, control systems, home/building automation, and the like, to be included the Internet of Things (IoT). In order to utilize Internet IoT devices are provided with an IP address as a unique identifier. The IoT devices may be provided with a radio transmitter, such as WLAN or Bluetooth transmitter or a RFID tag. Alternatively, IoT devices may have access to an IP-based network via a wired network, such as an Ethernet-based network or a power-line connection (PLC).

An MPEG-2 transport stream (TS), specified in ISO/IEC 13818-1 or equivalently in ITU-T Recommendation H.222.0, is a format for carrying audio, video, and other media as well as program metadata or other metadata, in a multiplexed stream. A packet identifier (PID) is used to identify an elementary stream (a.k.a. packetized elementary stream) within the TS. Hence, a logical channel within an MPEG-2 TS may be considered to correspond to a specific PID value.

Available media file format standards include ISO base media file format (ISO/IEC 14496-12, which may be abbreviated ISOBMFF) and file format for NAL unit structured video (ISO/IEC 14496-15), which derives from the ISOBMFF.

Video codec consists of an encoder that transforms the input video into a compressed representation suited for storage/transmission and a decoder that can decompress the compressed video representation back into a viewable form. A video encoder and/or a video decoder may also be separate from each other, for example, need not form a codec. Typically, encoder discards some information in the original video sequence in order to represent the video in a more compact form (e.g., at lower bitrate).

Typical hybrid video encoders, for example, many encoder implementations of ITU-T H.263 and H.264, encode the video information in two phases. Firstly pixel values in a certain picture area (or 'block') are predicted, for example, by motion compensation means (finding and indicating an area in one of the previously coded video frames that corresponds closely to the block being coded) or by spatial means (using the pixel values around the block to be coded in a specified manner). Secondly the prediction error, for example, the difference between the predicted block of pixels and the original block of pixels, is coded. This is typically done by transforming the difference in pixel values using a specified transform (for example, Discrete Cosine Transform (DCT) or a variant of it), quantizing the coefficients and entropy coding the quantized coefficients. By varying the fidelity of the quantization process, encoder can control the balance between the accuracy of the pixel representation (picture quality) and size of the resulting coded video representation (file size or transmission bitrate).

In temporal prediction, the sources of prediction are previously decoded pictures (a.k.a. reference pictures). In intra block copy (IBC; a.k.a. intra-block-copy prediction and current picture referencing), prediction is applied similarly to temporal prediction, but the reference picture is the current picture and only previously decoded samples can be referred in the prediction process. Inter-layer or inter-view prediction may be applied similarly to temporal prediction, but the reference picture is a decoded picture from another scalable layer or from another view, respectively. In some cases, inter prediction may refer to temporal prediction only, while in other cases inter prediction may refer collectively to temporal prediction and any of intra block copy, inter-layer prediction, and inter-view prediction provided that they are performed with the same or similar process than temporal prediction. Inter prediction or temporal prediction may sometimes be referred to as motion compensation or motion-compensated prediction.

Inter prediction, which may also be referred to as temporal prediction, motion compensation, or motion-compensated prediction, reduces temporal redundancy. In inter prediction the sources of prediction are previously decoded pictures. Intra prediction utilizes the fact that adjacent pixels within the same picture are likely to be correlated. Intra prediction can be performed in spatial or transform domain, for example, either sample values or transform coefficients can be predicted. Intra prediction is typically exploited in intra coding, where no inter prediction is applied.

One outcome of the coding procedure is a set of coding parameters, such as motion vectors and quantized transform coefficients. Many parameters can be entropy-coded more efficiently when they are predicted first from spatially or temporally neighboring parameters. For example, a motion vector may be predicted from spatially adjacent motion vectors and only the difference relative to the motion vector predictor may be coded. Prediction of coding parameters and intra prediction may be collectively referred to as in-picture prediction.

FIG. 4 shows a block diagram of a general structure of a video encoder. FIG. 4 presents an encoder for two layers, but it would be appreciated that presented encoder may be similarly extended to encode more than two layers. FIG. 4 illustrates a video encoder comprising a first encoder section 500 for a base layer and a second encoder section 502 for an enhancement layer. Each of the first encoder section 500 and the second encoder section 502 may comprise similar elements for encoding incoming pictures. The encoder sections 500, 502 may comprise a pixel predictor 302, 402, prediction error encoder 303, 403 and prediction error decoder 304, 404. FIG. 4 also shows an embodiment of the pixel predictor 302, 402 as comprising an inter-predictor 306, 406, an intra-predictor 308, 408, a mode selector 310, 410, a filter 316, 416, and a reference frame memory 318, 418. The pixel predictor 302 of the first encoder section 500 receives base layer image(s) 300 of a video stream to be encoded at both the inter-predictor 306 (which determines the difference between the image and a motion compensated reference frame) and the intra-predictor 308 (which determines a prediction for an image block based only on the already processed parts of current frame or picture). The output of both the inter-predictor and the intra-predictor are passed to the mode selector 310. The intra-predictor 308 may have more than one intra-prediction modes. Hence, each mode may perform the intra-prediction and provide the predicted signal to the mode selector 310. The mode selector 310 also receives a copy of the base layer image 300. Correspondingly, the pixel predictor 402 of the second encoder section 502 receives enhancement layer image(s) 400 of a video stream to be encoded at both the inter-predictor 406 (which determines the difference between the image and a motion compensated reference frame) and the intra-predictor 408 (which determines a prediction for an image block based only on the already processed parts of current frame or picture). The output of both the inter-predictor and the intra-predictor are passed to the mode selector 410. The intra-predictor 408 may have more than one intra-prediction modes. Hence, each mode may perform the intra-prediction and provide the predicted signal to the mode selector 410. The mode selector 410 also receives a copy of the enhancement layer picture 400.

Depending on which encoding mode is selected to encode the current block, the output of the inter-predictor 306, 406 or the output of one of the optional intra-predictor modes or the output of a surface encoder within the mode selector is passed to the output of the mode selector 310, 410. The output of the mode selector 310, 410 is passed to a first summing device 321, 421. The first summing device may subtract the output of the pixel predictor 302, 402 from the base layer image 300/enhancement layer image 400 to produce a first prediction error signal 320, 420 which is input to the prediction error encoder 303, 403.

The pixel predictor 302, 402 further receives from a preliminary reconstructor 339, 439 the combination of the prediction representation of the image block 312, 412 and the output 338, 438 of the prediction error decoder 304, 404. The preliminary reconstructed image 314, 414 may be passed to the intra-predictor 308, 408 and to a filter 316, 416. The filter 316, 416 receiving the preliminary representation may filter the preliminary representation and output a final reconstructed image 340, 440 which may be saved in a reference frame memory 318, 418. The reference frame memory 318 may be connected to the inter-predictor 306 to be used as the reference image against which a future base layer image 300 is compared in inter-prediction operations. Subject to the base layer being selected and indicated to be source for inter-layer sample prediction and/or inter-layer motion information prediction of the enhancement layer according to some embodiments, the reference frame memory 318 may also be connected to the inter-predictor 406 to be used as the reference image against which a future enhancement layer images 400 is compared in inter-prediction operations. Moreover, the reference frame memory 418 may be connected to the inter-predictor 406 to be used as the reference image against which a future enhancement layer image 400 is compared in inter-prediction operations.

Filtering parameters from the filter 316 of the first encoder section 500 may be provided to the second encoder section 502 subject to the base layer being selected and indicated to be source for predicting the filtering parameters of the enhancement layer according to some embodiments.

The prediction error encoder 303, 403 comprises a transform unit 342, 442 and a quantizer 344, 444. The transform unit 342, 442 transforms the first prediction error signal 320, 420 to a transform domain. The transform is, for example, the DCT transform. The quantizer 344, 444 quantizes the transform domain signal, for example, the DCT coefficients, to form quantized coefficients.

The prediction error decoder 304, 404 receives the output from the prediction error encoder 303, 403 and performs the opposite processes of the prediction error encoder 303, 403 to produce a decoded prediction error signal 338, 438 which, when combined with the prediction representation of the image block 312, 412 at the second summing device 339, 439, produces the preliminary reconstructed image 314, 414. The prediction error decoder may be considered to comprise a dequantizer 346, 446, which dequantizes the quantized coefficient values, for example, DCT coefficients, to reconstruct the transform signal and an inverse transformation unit 348, 448, which performs the inverse transformation to the reconstructed transform signal wherein the output of the inverse transformation unit 348, 448 contains reconstructed block(s). The prediction error decoder may also comprise a block filter which may filter the reconstructed block(s) according to further decoded information and filter parameters.

The entropy encoder 330, 430 receives the output of the prediction error encoder 303, 403 and may perform a suitable entropy encoding/variable length encoding on the signal to provide error detection and correction capability. The outputs of the entropy encoders 330, 430 may be inserted into a bitstream, for example, by a multiplexer 508.

Figures 5, 6:
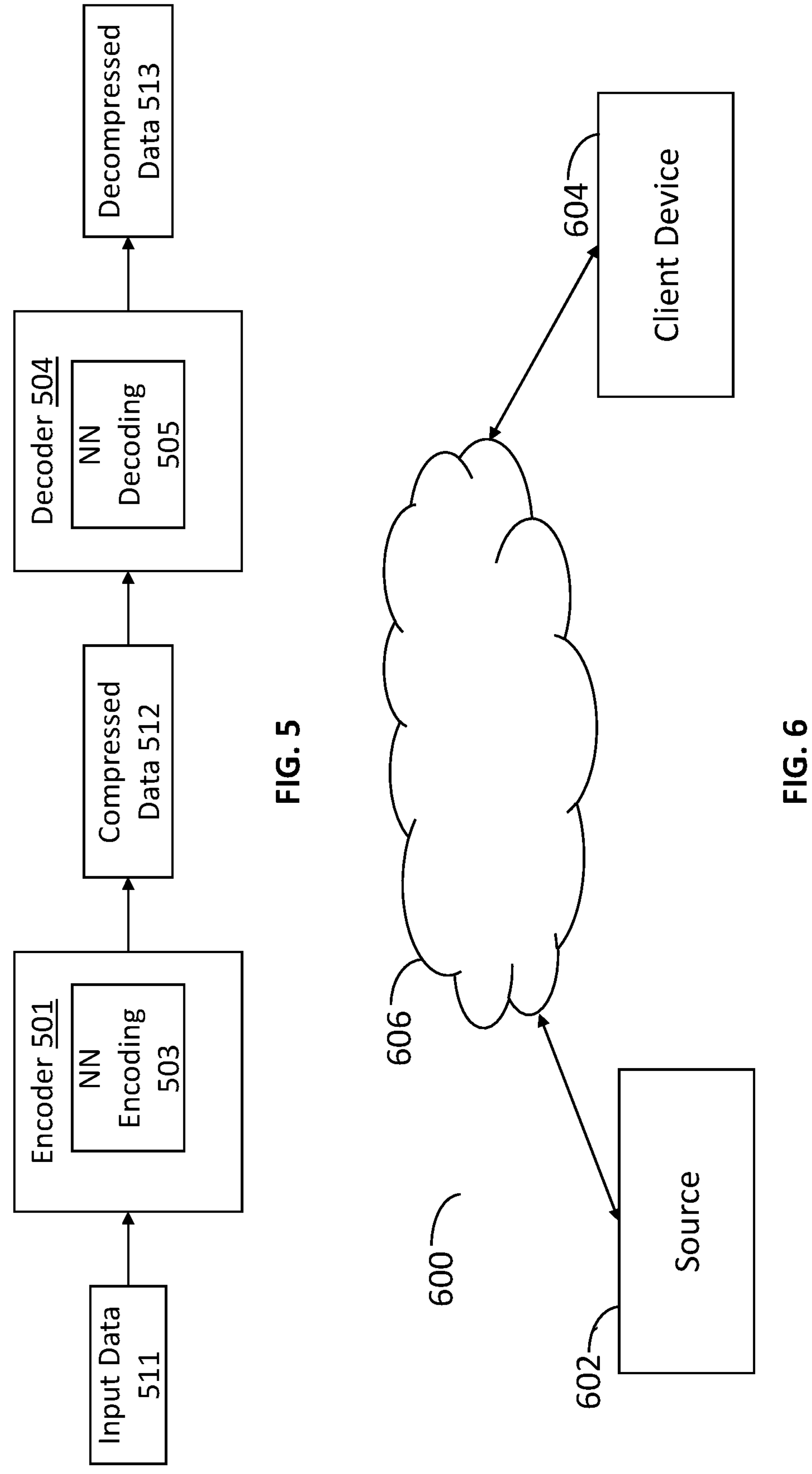
FIG. 5 is a block diagram showing an interface between an encoder and a decoder in accordance with the examples described herein.
FIG. 6 illustrates a system configured to support streaming of media data from a source to a client device.

FIG. 5 is a block diagram showing the interface between an encoder 501 implementing neural network encoding 503, and a decoder 504 implementing neural network decoding 505 in accordance with the examples described herein. The encoder 501 may embody a device, software method or hardware circuit. The encoder 501 has the goal of compressing input data 511 (for example, an input video) to compressed data 512 (for example, a bitstream) such that the bitrate is minimized, and the accuracy of an analysis or processing algorithm is maximized. To this end, the encoder 501 uses an encoder or compression algorithm, for example to perform neural network encoding 503.

The general analysis or processing algorithm may be part of the decoder 504. The decoder 504 uses a decoder or decompression algorithm, for example to perform the neural network decoding 505 to decode the compressed data 512 (for example, compressed video) which was encoded by the encoder 501. The decoder 504 produces decompressed data 513 (for example, reconstructed data).

The encoder 501 and decoder 504 may be entities implementing an abstraction, may be separate entities or the same entities, or may be part of the same physical device.

The analysis/processing algorithm may be any algorithm, traditional or learned from data. In the case of an algorithm which is learned from data, it is assumed that this algorithm can be modified or updated, for example, by using optimization via gradient descent. One example of the learned algorithm is a neural network.

The method and apparatus of an example embodiment may be utilized in a wide variety of systems, including systems that rely upon the compression and decompression of media data and possibly also the associated metadata. In one embodiment, however, the method and apparatus are configured to compress the media data and associated metadata streamed from a source via a content delivery network to a client device, at which point the compressed media data and associated metadata is decompressed or otherwise processed. In this regard, FIG. 6 depicts an example of such a system 600 that includes a source 602 of media data and associated metadata. The source may be, in one embodiment, a server. However, the source may be embodied in other manners if so desired. The source is configured to stream boxes containing the media data and associated metadata to the client device 604. The client device may be embodied by a media player, a multimedia system, a video system, a smart phone, a mobile telephone or other user equipment, a personal computer, a tablet computer or any other computing device configured to receive and decompress the media data and process associated metadata. In the illustrated embodiment, boxes of media data and boxes of metadata are streamed via a network 606, such as any of a wide variety of types of wireless networks and/or wireline networks. The client device is configured to receive structured information containing media, metadata and any other relevant representation of information containing the media and the metadata and to decompress the media data and process the associated metadata (e.g. for proper playback timing of decompressed media data).

Figure 7:
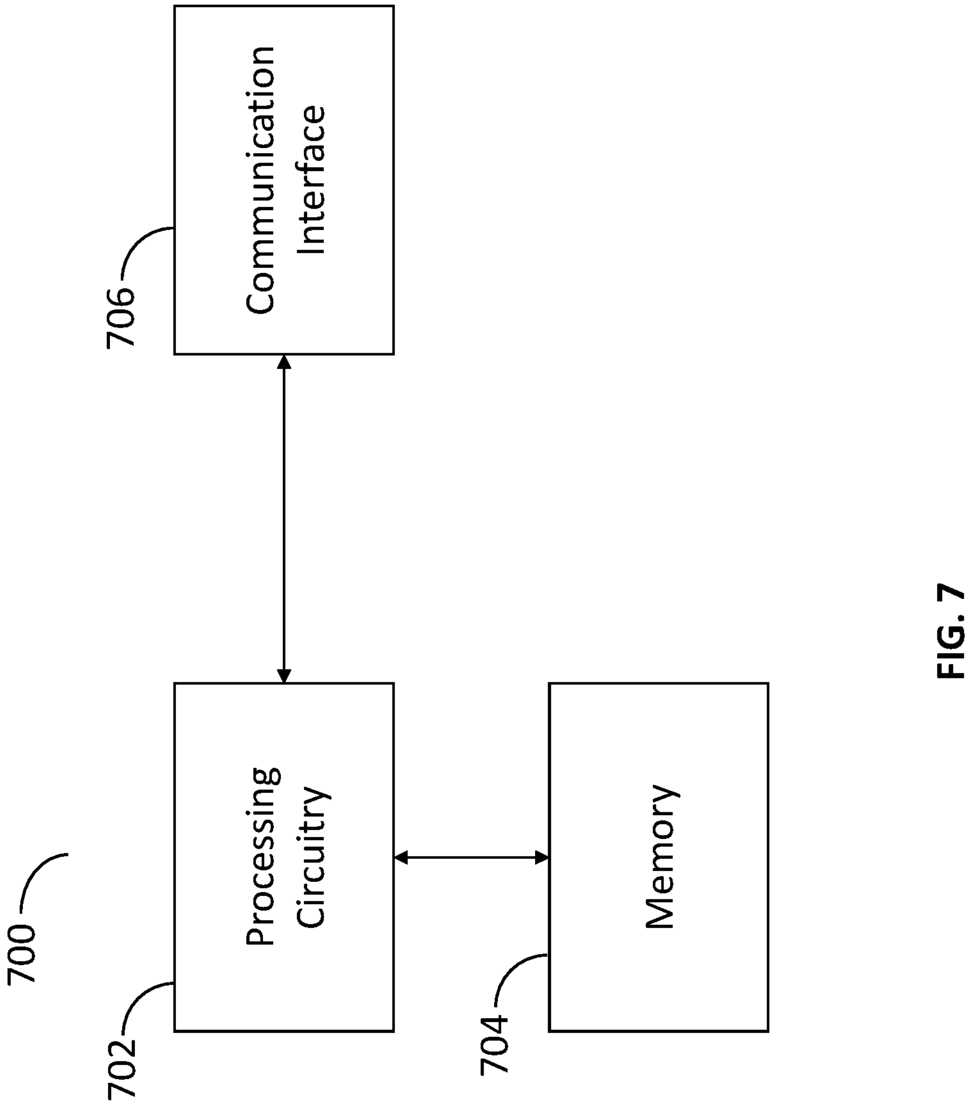
FIG. 7 is a block diagram of an apparatus that may be configured in accordance with an example embodiment.

An apparatus 700 is provided in accordance with an example embodiment as shown in FIG. 7. In one embodiment, the apparatus of FIG. 7 may be embodied by a source 602, such as a file writer which, in turn, may be embodied by a server, that is configured to stream a compressed representation of the media data and associated metadata. In an alternative embodiment, the apparatus may be embodied by a client device 604, such as a file reader which may be embodied, for example, by any of the various computing devices described above. In either of these embodiments and as shown in FIG. 7, the apparatus of an example embodiment includes, is associated with or is in communication with a processing circuitry 702, one or more memory devices 704, a communication interface 706, and optionally a user interface.

The processing circuitry 702 may be in communication with the memory device 704 via a bus for passing information among components of the apparatus 700. The memory device may be non-transitory and may include, for example, one or more volatile and/or non-volatile memories. In other words, for example, the memory device may be an electronic storage device (e.g., a computer readable storage medium) comprising gates configured to store data (e.g., bits) that may be retrievable by a machine (e.g., a computing device like the processing circuitry). The memory device may be configured to store information, data, content, applications, instructions, or the like for enabling the apparatus to carry out various functions in accordance with an example embodiment of the present disclosure. For example, the memory device may be configured to buffer input data for processing by the processing circuitry. Additionally or alternatively, the memory device may be configured to store instructions for execution by the processing circuitry.

The apparatus 700 may, in some embodiments, be embodied in various computing devices as described above. However, in some embodiments, the apparatus may be embodied as a chip or chip set. In other words, the apparatus may comprise one or more physical packages (e.g., chips) including materials, components and/or wires on a structural assembly (e.g., a baseboard). The structural assembly may provide physical strength, conservation of size, and/or limitation of electrical interaction for component circuitry included thereon. The apparatus may therefore, in some cases, be configured to implement an embodiment of the present disclosure on a single chip or as a single 'system on a chip.' As such, in some cases, a chip or chipset may constitute means for performing one or more operations for providing the functionalities described herein.

The processing circuitry 702 may be embodied in a number of different ways. For example, the processing circuitry may be embodied as one or more of various hardware processing means such as a coprocessor, a microprocessor, a controller, a digital signal processor (DSP), a processing element with or without an accompanying DSP, or various other circuitry including integrated circuits such as, for example, an ASIC (application specific integrated circuit), an FPGA (field programmable gate array), a microcontroller unit (MCU), a hardware accelerator, a special-purpose computer chip, or the like. As such, in some embodiments, the processing circuitry may include one or more processing cores configured to perform independently. A multi-core processing circuitry may enable multiprocessing within a single physical package. Additionally or alternatively, the processing circuitry may include one or more processors configured in tandem via the bus to enable independent execution of instructions, pipelining and/or multithreading.

In an example embodiment, the processing circuitry 702 may be configured to execute instructions stored in the memory device 704 or otherwise accessible to the processing circuitry. Alternatively or additionally, the processing circuitry may be configured to execute hard coded functionality. As such, whether configured by hardware or software methods, or by a combination thereof, the processing circuitry may represent an entity (e.g., physically embodied in circuitry) capable of performing operations according to an embodiment of the present disclosure while configured accordingly. Thus, for example, when the processing circuitry is embodied as an ASIC, FPGA or the like, the processing circuitry may be specifically configured hardware for conducting the operations described herein. Alternatively, as another example, when the processing circuitry is embodied as an executor of instructions, the instructions may specifically configure the processing circuitry to perform the algorithms and/or operations described herein when the instructions are executed. However, in some cases, the processing circuitry may be a processor of a specific device (e.g., an image or video processing system) configured to employ an embodiment of the present invention by further configuration of the processing circuitry by instructions for performing the algorithms and/or operations described herein. The processing circuitry may include, among other things, a clock, an arithmetic logic unit (ALU) and logic gates configured to support operation of the processing circuitry.

The communication interface 706 may be any means such as a device or circuitry embodied in either hardware or a combination of hardware and software that is configured to receive and/or transmit data, including video bitstreams. In this regard, the communication interface may include, for example, an antenna (or multiple antennas) and supporting hardware and/or software for enabling communications with a wireless communication network. Additionally or alternatively, the communication interface may include the circuitry for interacting with the antenna(s) to cause transmission of signals via the antenna(s) or to handle receipt of signals received via the antenna(s). In some environments, the communication interface may alternatively or also support wired communication. As such, for example, the communication interface may include a communication modem and/or other hardware/software for supporting communication via cable, digital subscriber line (DSL), universal serial bus (USB) or other mechanisms.

In some embodiments, the apparatus 700 may optionally include a user interface that may, in turn, be in communication with the processing circuitry 702 to provide output to a user, such as by outputting an encoded video bitstream and, in some embodiments, to receive an indication of a user input. As such, the user interface may include a display and, in some embodiments, may also include a keyboard, a mouse, a joystick, a touch screen, touch areas, soft keys, a microphone, a speaker, or other input/output mechanisms. Alternatively or additionally, the processing circuitry may comprise user interface circuitry configured to control at least some functions of one or more user interface elements such as a display and, in some embodiments, a speaker, ringer, microphone and/or the like. The processing circuitry and/or user interface circuitry comprising the processing circuitry may be configured to control one or more functions of one or more user interface elements through computer program instructions (e.g., software and/or firmware) stored on a memory accessible to the processing circuitry (e.g., memory device, and/or the like).

Various devices and systems described in the FIGS. 1 to 7 enable mechanisms for implementing incremental weight update compression interpretation into a neural network representation bitstream. A neural network representation (NNR) describes compression of neural networks for efficient transport. Some example high-level sytax (HLS) relevant to the technologies of weight update compression, are described by various embodiments of the present invention.

Figure 8:
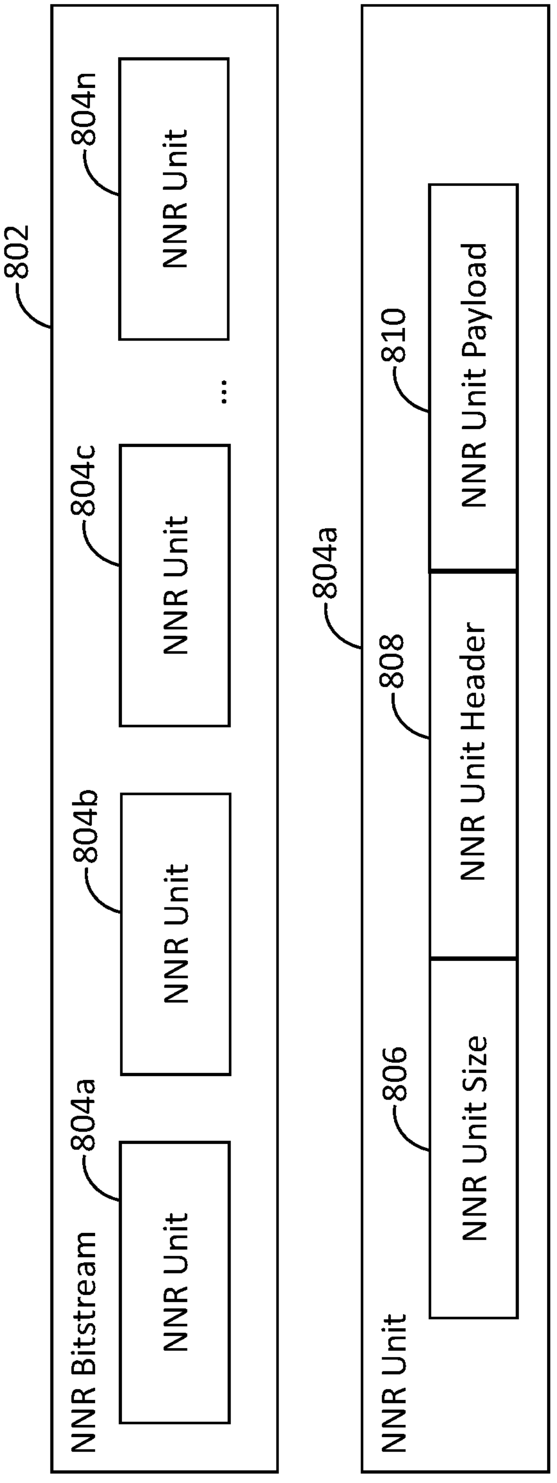
FIG. 8 illustrates example structure of a neural network representation (NNR) bitstream and an NNR unit, in accordance with an embodiment.

FIG. 8 illustrates example structure of a neural network representation (NNR) bitstream 802 and an NNR unit 804*a*, in accordance with an embodiment. An NNR bitstream may conform to compression of neural networks for multimedia content description and analysis). NNR specifies a high-level bitstream syntax (HLS) for signaling compressed neural network data in a channel as a sequence of NNR units as illustrated in FIG. 8. As depicted in FIG. 8, according to this structure, an NNR bitstream 802 includes multiple elemental units termed NNR Units (e.g. NNR units 804*a*, 804*b*, 804*c*, . . . 804*n*). An NNR Unit (e.g., the NNR unit 804*a*) represents a basic high-level syntax structure and includes three syntax elements: an NNR Unit Size 806, an NNR unit header 808, an NNR unit payload 810.

Each NNR unit may have a type that defines the functionality of the NNR Unit and allows correct interpretation and decoding procedures to be invoked. In an embodiment, NNR units may contain different types of data. The type of data that is contained in the payload of an NNR Unit defines the NNR Unit's type. This type is specified in the NNR unit header. The following table specifies the NNR unit header types and their identifiers.

| nnr_unit_type | Identifier | NNR Unit Type | Description |
|---|---|---|---|
| 0 | NNR_STR | NNR start unit | Compressed neural network bitstream start indicator |
| 1 | NNR_MPS | NNR model parameter set data unit | Neural network global metadata and information |
| 2 | NNR_LPS | NNR layer parameter set data unit | Metadata related to a partial representation of neural network |
| 3 | NNR_TPL | NNR topology data unit | Neural network topology information |

-continued

| nnr_unit_type | Identifier | NNR Unit Type | Description |
|---|---|---|---|
| 4 | NNR_QNT | NNR quantization data unit | Neural network quantization information |
| 5 | NNR_NDU | NNR compressed data unit | Compressed neural network data |
| 6 | NNR_AGG | NNR aggregate unit | NNR unit with payload containing multiple NNR units |
| 7 . . . 31 | NNR_RSVD | Reserved | MPEG-reserved range |
| 32 . . . 63 | NNR_UNSP | Unspecified | Unspecified range |

NNR unit is data structure for carrying neural network data and related metadata which is compressed or represented using this specification. NNR units carry compressed or uncompressed information about neural network metadata, topology information, complete or partial layer data, filters, kernels, biases, quantization weights, tensors, or the like. An NNR unit may include following data elements:

NNR unit size: This data element signals the total byte size of the NNR Unit, including the NNR unit size.

NNR unit header: This data element contains information about the NNR unit type and related metadata.

NNR unit payload: This data element contains compressed or uncompressed data related to the neural network.

NNR bitstream is composed of a sequence of NNR Units and/or aggregate NNR units. The first NNR unit in an NNR bitstream shall be an NNR start unit (e.g. NNR unit of type NNR_STR).

Neural Network topology information can be carried as NNR units of type NNR_TPL. Compressed NN information can be carried as NNR units of type NNR_NDU. Parameter sets can be carried as NNR units of type NNR_MPS and NNR_LPS. An NNR bitstream is formed by serializing these units.

Image and video codecs may use one or more neural networks at decoder side, either within the decoding loop or as a post-processing step, for both human-targeted and machine targeted compression.

Some of the example implementations proposed by various embodiments are described below:

NNR Model Parameter Set Unit Header Syntax:

| | Descriptor |
|---|---|
| nnr_model_parameter_set_header( ) { | |
| } | |

NNR Model Parameter Set Unit Payload Syntax:

| | Descriptor |
|---|---|
| nnr_model_parameter_set_payload( ) { | |
| topology_carriage_flag | u(1) |
| mps_sparsification_flag | u(1) |
| mps_pruning_flag | u(1) |
| mps_unification_flag | u(1) |
| mps_decomposition_performance_map_flag | u(1) |
| mps_quantization_method_flags | u(3) |
| if((mps_quantization_method_flags & NNR_QSU) == NNR_QSU \|\| (mps_quantization_method_flags & NNR_QCB) == NNR_QCB) { | |
| mps_qp_density | u(3) |
| mps_quantization_parameter | i(13) |
| } | |
| if(mps_sparsification_flag == 1) | |
| sparsification_performance_map( ) | |
| if(mps_pruning_flag == 1) | |
| pruning_performance_map( ) | |
| if(mps_unification_flag == 1) | |
| unification_performance_map( ) | |
| if(mps_decomposition_performance_map_flag == 1) | |
| decomposition_performance_map( ) | |
| } | |

Quantization Method Identifiers for the Case NN Compression:

| Quantization method | Quantization method ID | Value |
|---|---|---|
| Scalar uniform | NNR_QSU | 0x01 |
| Codebook | NNR_QCB | 0x02 |
| Reserved | | 0x04-0x07 |

Some examples of data definitions and data types related to the various embodiments are described in following paragraphs:

ue(k): unsigned integer k-th order, e.g. Exp-Golomb-coded syntax element. The parsing process for this descriptor is according to the following pseudo-code with x as a result:

```
x = 0
bit = 1
while( bit ) {
  bit = 1 − u( 1 )
  x += bit << k
  k += 1
}
k −= 1
if( k > 0 )
  x += u( k )
```

ie(k): signed integer k-th order, e.g. Exp-Golomb-coded syntax element. The parsing process for this descriptor is according to the following pseudo-code with x as a result:

```
val = ue( k )
if( (val & 1) != 0 )
  x = ((val+1)>>1)
else
  x = − (val>>1)
```

A payload identifier may suggest the decoding method. Following table provides NNR compressed data payload types:

| Payload identifier | Description | nnr_compressed_data_unit_payload_type | Sub-clause |
|---|---|---|---|
| NNR_PT_INT | integer parameter tensor | 0 | 7.3.2 |
| NNR_PT_FLOAT | float parameter tensor | 1 | 7.3.3 |
| NNR_PT_RAW_FLOAT | uncompressed float parameter tensor | 2 | 7.3.4 |
| NNR_PT_BLOCK | float parameter tensors including a (optionally decomposed) weight tensor and, optionally, local scaling parameters, biases, and batch norm parameters that form a block in the model architecture | 3 | 7.3.5 |

topologyInformation about potential changes caused by a pruning algorithm is provided in nnr_topology_unit_payload( ):

| | Descriptor |
|---|---|
| nnr_topology_unit_payload( ) { | |
| if( topology_storage_format == NNR_TPL_PRUN ) | |
| nnr_pruning_topology_container( ) | |
| else | |
| topology_data | bs(v) |
| } | |

nnr_pruning_topology_container( ) is specified as follows:

| | Descriptor |
|---|---|
| nnr_pruning_topology_container( ) { | |
| nnr_rep_type | u(2) |
| prune_flag | u(1) |
| order_flag | u(1) |
| sparse_flag | u(1) |
| nnr_reserved_zero_3bits | u(3) |
| if (prune_flag == 1) { | |
| if (nnr_rep_type && NNR_TPL_BMSK) | |
| bit_mask( ) | |
| else if (nnr_rep_type && NNR_TPL_DICT) { | |
| count_ids | u(8) |
| for (j = 0; j < count_ids; j ++) | |
| element_id[j] | st(v) |
| for (j = 0; j < count_ids; j ++) { | |
| count_dims[j] | ue(1) |
| for(k = 0; k < count_dims; k++){ | |
| dim[j][k] | ue(7) |
| } | |
| } | |
| byte_alignment( ) | |
| } | |
| } | |
| if (sparse_flag == 1) { | |
| bit_mask( ) | |
| } | |
| } | |

bit_mask( ) is specified as follows:

| | Descriptor |
|---|---|
| bit_mask( ) { | |
| count_bits | u(32) |
| for(j = 0; j < count_bits; j++ ) { | |
| bit_mask_value[j] | u(1) |
| } | |
| byte_alignment( ) | |
| } | |

Various embodiments propose mechanisms for introducing weight update compression interpretation into the NNR bitstream. Some example proposals include mechanisms for:

- Signalling incremental weight update compression mode of operation;
- Potential introduction of a weight update unit type among NNR unit types;
- Signalling mechanisms required for dithering algorithms;
- Signalling global random seed;
- Signalling if a model is an inference friendly quantized model;
- Signalling incremental weight update quantization algorithms;
- Signalling federated averaging weight update algorithm;
- Signalling supporting down-stream compression support;
- Signalling asynchronous incremental weight update mode;
- Source_id and operation_id to identify state of communicated information;
- Global codebook approaches for weight update quantization;
- Extension to some of the data payload types and payload;
- Syntax and semantics of some quantization algorithms;
- Encoding and decoding procedures of bitmask applicable to quantization algorithm outputs; and
- Syntax and semantics associated with topology change.

incremental_weight_update_flag: the incremental weight update flag is a flag that signals a decoder that the bitstream is corresponding to a weight update compression and not a weight compression. The incremental_weight_update_flag indicates to the decoder to invoke a correct decoding mechanism upon receiving the data and decode the correct payload types.

For example, when the incremental_weight_update_flag is set to value 1, it means that the NNR_QNT or NNR_NDU consist of a data specific to weight update compression and decompression algorithms. The same applies to the interpretation of other data units.

Incremental_weight_update_flag may be introduced into different locations in the existing NNR v1 syntax and semantics. One suggested location may be nnr_model_parameter_set_header( ), for example:

| | Descriptor |
|---|---|
| nnr_model_parameter_set_header( ) { | |
| incremental_weight_update_flag | u(1) |
| } | |

In an embodiment, nnr_model_parameter_set_header( ) may be stored in the NNR payload data or its header.

NNR Weight Update Unit (NNR_WUU): a data unit of type NNR weight update compression data unit type may be an alternative to adapting the existing data units from NNR v1 syntax, identified as NNR_WUU (NNR weight update unit). This data unit may contain information relevant to weight update strategies.

dithering_flag: to support dithering techniques in quantization, encoding and decoding pipelines, a flag, e.g., dithering_flag is introduced. For example, when dithering_flag is set to value 1, a random seed is present that may be used for all the computations. During the decoding process the client may use the random seed to generate a random sequence which will be used during the reconstruction of the quantized values.

random_seed: a global random seed may be required for some algorithms. For example, in dithering dependent algorithms, a global random seed may used. Some embodiments propose random seed to be part of the information to be signalled.

Inference_friendly_flag: in NN compression, a model may be inference friendly, e.g., its weight and/or activations may be quantized. In weight update compression, such methods may require specific algorithmic treatment. Accordingly, some embodiments propose signalling the presence of such models in the bitstream.

quantized_weight_update_flag: indicates when the weight updates are quantized or, instead, there has been no quantization involved. Alternatively, the quantization_algorithm_id may be used to indicate that no quantization algorithm was applied to the weight updates by defining an id for such a case.

quantization_algorithm_id: an algorithm identifier that is signalled for the weight update quantization. The decoder may use this information for performing a suitable dequantization operation. Example algorithms may include:

| Quantization algorithms | Description | quantization_algorithm_id |
|---|---|---|
| SIGN_SGD_QUANT | Sign SGD quantization | 0x01 |
| TR_TERNARY_QUANT | Trainable ternary quantization | 0x02 |
| SC_BINARY_QUANT | Scaled binary quantization | 0x03 |
| SS_TERNARY_QUANT | Single scale ternary quantization | 0x04 |
| DS_TERNARY_QUANT | Double scale ternary quantization | 0x05 |
| GLOBAL_CODEBOOK_QUANT | Global codebook quantization | 0x06 |
| Reserved | | 0x07- |

An alternative example to quantization_algorithm_id may be that when the incremental_weight_update_flag indicates a weight update compression mode, the interpretation of mps_quantization_method_flags may be according to the quantization techniques for weight update compression. In this example, the quantization method identifiers may be interpreted or complemented with the identifiers relevant to the incremental weight update compression, e.g., the mapping of quantization method identifier to the actual quantization algorithm is performed by using a difference look-up table, such as the table above.

fed_alg_id: in case of federated algorithm, an agreed federated learning algorithm id may be signalled. Example of id may include FedAVG, FedProx, and the like. Another example usage may be for indicating a specific step, such as, enabling a specific loss function during training process.

For example, the fed_alg_id may take one of the values in the following table:

| Federated learning algorithm | Description | Fed_alg_id |
|---|---|---|
| FedAVG | Average-based aggregation | 0x01 |
| FedProx | Proximal training at client side | 0x02 |
| Reserved | | 0x03- |

elapsed_time: is a data field that communicates the time passed from the last communication between two parties, the data field may be used from a server to a client communication or from the client to the server. The elapsed_time may be used in conjunction with a flag to determine the direction of the communication or in another embodiment, two elapsed_time data fields, one for each communication directions. In another embodiment, the elapsed_time may indicate the number of rounds of communication between the server and the client, instead of the duration that passed.

server_round_ID: specifies a unique identifier for the communication round from the server to one or more clients. The value of the identifier may be derived from the value that server_round_ID had in the previous communication round from the server to one or more clients, for example, it can be incremented by 1.

client_round_ID specifies a unique identifier for the communication round from a client to a server. The identifier may be, for example, the same value that the server had previously signalled to the client, or a value which may be derived from the value that the server had previously signalled to the client (for example, an incremented value).

model_reference_ID is an ID that indicates what model may be used as a base model. The model_reference_ID may indicate a topology of the base model, or both the topology and an initialization of at least some of the weights of the base model. The training session may be performed by the client, by training the base model. Weight-updates may be derived from the weights of the base model before the training performed by the client and the weights of the base model after the training performed by the client. The model reference id may point to a URI or include a name identifier predefined and globally distributed, for example, to all participants.

weight_reference_ID specifies a unique identifier of the weights for a base model.

validation set performance: In a communication from a server to a client, the validation set performance may signal to the client a performance indication, determined based on a validation set. In a communication from the client to the server, the validation set performance may include an indication of what performance level a weight-update associated to this validation_set_performance may achieve, where the performance level may be determined based on a validation dataset present at client's side. This may be informative for the server on how to use the received weight-update from that client. For example, the server may decide to multiply the received weight-updates from clients by using multiplier values derived from the validation_set_performance values received from clients. This information may be available on one side of the communications or both communication ends.

Copy_client_wu may be used in the bitstream sent by a client to a server, for indicating to use the latest weight-update received from this client as the new weight-update.

In other words, after receiving this information, the server may copy the previous weight-update received from this client and re-use it as the current weight-update from this client. The client may not need to send the actual weight-update data which may be a replica of the previous weight-update.

Copy_server_wu may be used in the bitstream sent by a server to a client, for indicating to use the latest weight-update received from the server as the new weight-update from the server. This weight-update from the server may be a weight-update, which was obtained by aggregating one or more weight-updates received from one or more clients. In some other embodiment, this syntax element may be used for indicating to use the latest weights (instead of weight-update) received from the server as the new weights from the server. The server may not need to send the actual weight-update which may be a replica of the previous weight update.

dec_update may specify an update to a decoder neural network, where the decoder neural network may be a neural network that performs one of the operations for decoding a weight-update.

prob_update may specify an update to a probability model, where the probability model may be a neural network that estimates a probability to be used by a lossless decoder (such as an arithmetic decoder) for losslessly decoding a weight-update.

cache_enabled_flag may specify whether a caching mechanism is available and may be enabled to store weight updates on the server or on the client.

cache_depth may specify what is the number of cached sequences of weight updates that are stored. It may use to signal to what depth of stored data may an encoding or decoding process refer. The cache depth may be gated to save space in the bitstream, e.g., using cache_enabled_flag.

downstream_flag: This flag indicates whether downstream compression is used, where downstream refers to the communication direction from server to client(s). The server may or may not perform downstream compression depending on the configuration. This information may also be signaled at the session initialization. If downstream_flag is set to 1, the receiver of the bitstream may need to perform a decompression operation on the received bitstream.

async_flag: depending on the mode of operation the clients may work in an asynchronous mode, that is after they upload their information to the server, they continue their training procedure and apply a specific treatment to the downstream information that they get. Similarly, server may require specific steps as receiving the information from clients to treat them. In such case, the async_flag may be communicated to indicate such operation is allowed if the clients have the capacity. This may also be done at the session initialization.

unique_operation_id: unique operation id allows communication of specific information, e.g., last time that the server and client met, and if necessary, some small synchronization information. Such information may be provided as a specific unique identifier consisting of some pieces of information specifically designed for each part of the communication, e.g., a specific client identifier, server identifier, elapsed time since last communication, etc. The information is not limited to the examples provided.

source_id: the source id is similar or substantially similar to the unique_operation id, it just indicates the identity of the source of the information, the source id may indicate the server or the client, depending on the value. The source_id may be defined as a flag to be interpreted as the communication direction or as a string identifier for providing more detailed information.

An example use case may be that the server may use this syntax element to correctly subtract from the global (aggregated weight update) a certain client's weight update. In an example, assume that a federated learning session involves two clients and a server. The server initially sends the initial model to the two clients. Each client uses its own data for training the model for a number of iterations. Each client may compute a weight-update as the difference between the weights of the model after the training iterations and the weights of the latest model received from the server. In another embodiment, the weight-update may be output by an auxiliary neural network, where the inputs to the auxiliary neural network are the weights of the model after the training iterations and the weights of the latest model received from the server. Each client communicates the weight-update or a compressed version of the weight-update, by also signaling a unique identifier of the client within the source_id syntax element. The server may compute an aggregated weight-update, for example, by averaging all or some of the weight-updates received from the clients. The aggregated weight-update may be communicated to the clients. For one or more of the clients, the server may decide to communicate a custom version of the aggregated weight-update, where the weight-update from a certain client with ID X is subtracted from the aggregated weight-update, and the resulting custom aggregated weight-update is communicated to the respective client with ID X. Thus, in this example, source_id would contain the client ID X. The information in source_id may therefore be used to communicate the correct custom aggregated weight-update to the clients. In another embodiment, the server may use the aggregated weight-update for updating the model, and subtract the weight-update of a certain client from the weights of the updated model, and the resulting custom weights of the updated model may be communicated to that client.

Global_codebook: this is different than codebook-based quantization for NNR compression where the codebook is calculated and transferred with the NN. One global codebook may exist, and it is shared once with all the devices (e.g. clients and/or server) who are collaborating (sending or receiving a weight update). Such a codebook information may be shared once with all the participants in the computation process. For example, in an implementation a global_codebook( ) may be shared, distributed, or hosted in a remotely accessible network location.

In another embodiment, such a codebook may be further compressed by some quantization algorithm since it represents weight update approximations.

Following example describes implementations of some of the proposed embodiments:

| | Descriptor |
|---|---|
| nnr_model_parameter_set_payload( ) { | |
| If (incremental_weight_update_falg) { | |
| Dithering | u(1) |
| inference_friendly | u(1) |

-continued

| | Descriptor |
|---|---|
| quantization_algorithm_id | u(6) |
| If (dithering) { | |
| random_seed | u(16) |
| } | |
| If (quantization_algorithm_id == GLOBAL_CODEBOOK_QUANT) { | |
| global_codebook( ) | |
| } else { | |
| topology_carriage_flag | u(1) |
| mps_sparsification_flag | u(1) |
| mps_pruning_flag | u(1) |
| mps_unification_flag | u(1) |
| mps_decomposition_performance_map_flag | u(1) |
| mps_quantization_method_flags | u(3) |
| if((mps_quantization_method_flags & NNR_QSU) == NNR_QSU \|\| (mps_quantization_method_flags & NNR_QCB) == NNR_QCB) { | |
| mps_qp_density | u(3) |
| mps_quantization_parameter | i(13) |
| } | |
| if(mps_sparsification_flag == 1) | |
| sparsification_performance_map( ) | |
| if(mps_pruning_flag == 1) | |
| pruning_performance_map( ) | |
| if(mps_unification_flag == 1) | |
| unification_performance_map( ) | |
| if(mps_decomposition_performance_map_flag == 1) | |
| decomposition_performance_map( ) | |
| } | |
| } | |

global_codebook( ): provides a shared codebook that may be defined as follows:

| | Descriptor |
|---|---|
| global_codebook( ) { | |
| number_of_elements | u(8) |
| for (i=0; i< number_of_elements; i++) { | |
| codebook_value[i] | flt(32) |
| } | |

Number_of_elements: provides number of elements in the codebook

Codebook_value: provides a value corresponding to the codebook element

In another embodiment, the global codebook may be defined based on a compressed codebook, for example:

| | Descriptor |
|---|---|
| global_codebook( ) { | |
| step_value | flt(32) |
| number_of_elements | u(8) |
| for (i=0; i< number_of_elements; i++) { | |
| quantized_codebook_value[i] | u(8) |
| } | |

step_value: the quantization step for the codebook.

quantized_codebook_value: is the uniform quantized value of a floating codebook_value obtained by floor(codebook_value/step_value).

For a compressed global codebook, a codebook_value[i] =step_value*quantized_codebook_value[i] is calculated after decoding the global codebook.

wu_pred_coeffs: this syntax element may be a list of coefficients to be used for predicting a weight-update from one or more previously decoded weight-updates. This syntax element may be used for example by a server, for predicting a weight-update of a client, given one or more previously decoded weight-updates from that client and one or more previously decoded weight-updates from one or more other clients.

wu_pred_wuids: this syntax element may be a list of IDs which identify uniquely one or more previously decoded weight-updates to be used for predicting the weight-update of a client. In an alternative implementation, this syntax element may be a list of tuples, where each tuple includes a first element which is an identifier of a client and a second element which is an identifier of the weight-update of the client identified by the first element.

wu_pred_mode_id: this syntax element may indicate what algorithm or more to be used for predicting a weight-update from one or more previously decoded weight-updates. This syntax element may be used for example by a server, for predicting a weight-update of a client, given one or more previously decoded weight-updates from that client and one or more previously decoded weight-updates from one or more other clients. For example, one algorithm ID may indicate to use a linear combination of previously decoded weight-updates, where the coefficients for the linear combination may be indicated by wu_pred_coeffs and where the previously decoded weight-updates to be used for the prediction may be indicated by wu_pred_wuids.

Embodiment Related to Distributed Data Processing Environments or Architectures:

As an alternative to a high-level syntax-based communication, the model parameter set information may be shared via some common storage in which a unique identifier may be used to determine the correct parameters and payloads. Such identifier may include a specific hash id, a time-stamped id that may be used by a server and/or a client to determine the correct payload for orderly processing of information.

Extension to NNR Compressed Data Payload Types

In an embodiment, it is proposed to add an incremental weight update type to the type of NNR compressed data payload types, as described in following table. The incremental weight update type may invoke the necessary encoding and decoding procedures for a specific algorithm.

NNR Compressed Data Payload Types

| Payload identifier | Description | nnr_compressed_data_unit_payload_type | Sub-clause |
|---|---|---|---|
| NNR_PT_INT | integer parameter tensor | 0 | 7.3.2 |
| NNR_PT_FLOAT | float parameter tensor | 1 | 7.3.3 |
| NNR_PT_RAW_FLOAT | uncompressed float parameter tensor | 2 | 7.3.4 |
| NNR_PT_BLOCK | float parameter tensors including a (optionally decomposed) weight tensor and, optionally, local scaling parameters, biases, and batch norm parameters that form a block in the model architecture | 3 | 7.3.5 |
| NNR_PT_INCWU | incremental weight update | 4 | |

Further, it is proposed to add data structures to the compressed data unit payload. The payload in combination with the quantization algorithm may result in the proper encoding and may invoke the proper decoding mechanism for weight updates. One example implementation is described in the following table:

| | Descriptor |
|---|---|
| nnr_compressed_data_unit_payload( ) { | |
| if( nnr_compressed_data_unit_payload_type == NNR_PT_RAW_FLOAT ) | |
| for( i = 0; i < Prod( TensorDimensions ); i++ ) | |
| raw_float32_parameter[ TensorIndex( TensorDimensions, i , 0 ) ] | flt(32) |
| if( nnr_compressed_data_unit_payload_type == NNR_PT_INCWU) | |
| incremental_weight_update_payload( ) | |
| Invoke subclause Error! Reference source not found. | |
| } | |

incremental_weight_update_payload( ): provides the correct data formats and invokes the necessary decoding procedures for the incremental weight update payload.

An Example Implementation of the Incremental Weight Update Payload:

Incremental_weighupdate_payload( ): is an abstraction that may include the semantics and encoded bitstream of a specific algorithms, or may include a pointer to a decoding mechanism that need to be invoked.

As an example, a compressed payload may be implemented, as described in the following table:

| | Descriptor |
|---|---|
| Incremental_weight_update_payload( ) { | |
| If (quantization_algorithm_id == SIGN_SGD_QUANT) { | |
| sign_sgd_quant_payload( ) | |
| } | |
| If (quantization_algorithm_id == TR_TERNARY_QUANT) { | |
| trainable_ternary_quant_payload( ) | |
| } | |
| If (quantization_algorithm_id == SC_BINARY_QUANT) { | |
| scaled_binary_quant_payload( ) | |
| } | |
| If (quantization_algorithm_id == SS_TERNARY_QUANT) { | |
| single_scale_ternary_quant_payload( ) | |
| } | |
| If (quantization_algorithm_id == DS_TERNARY_QUANT) { | |
| double_scale_ternary_quant_payload( ) | |
| } | |
| If (quantization_algorithm_id == GLOBAL_CODEBOOK_QUANT) { | |
| global_codebook_quant_payload( ) | |
| } | |
| } | |

In yet another embodiment, on the decoder side, incremental_weight_update_payload( ) may trigger a specific decoding mechanism where quantization_algorithm_id and NNR_PT_INCWU determine the decoding procedure according to the encoding procedure.

Syntax and Semantics of Quantization Algorithms

Different algorithms may result in different payload that necessities different encoding/decoding procedures. The output of the quantization may be directly outputted as efficient bitmask representations or encoded using some proper encoding mechanism, the example of such encoding mechanisms may include, a run-length encoding, a position encoding and RLE, a relative significant bit position encoding, or a combination of encoding mechanisms e.g., golomb-based encoding of relative RLE encoding. An example syntax for various quantization algorithms may be defined as following:

Sign sgd quantization: using a sign sgd produces a bit-mask indicating changes in the weight update compressions, the payload may be the following:

sign_sgd_quant_payload( ): defines the payload for the signSGD quantization, multiple implementations are possible, e.g., plane bitmask, in this example a bitmask_size may indicate the size of bitmask and the bit representation of the mask are transferred. Following may be an example implementation:

| | Descriptor |
|---|---|
| sign_sgd_quant_payload( ) { | |
| bit_mask_size | u(32) |
| for (i=0; i < bit_mask_size; i++) { | |
| Bitmask_values[i] | u(1) |

-continued

```
                                                        Descriptor
      }
    }
```

Bit_mask_size: indicates size of bitmask. The size of bitmask descriptor may be gated by some flag to allow variable length bitmask sizes.

Bit_mask_values: represents an array of bit values in the bitmask.

scaled_binary_quant_payload( ): represents the semantics for scaled binary quantization of weight updates. In this method each weight update may be represented by a nonzero mean of values in the strongest direction (positive or negative). Accordingly, a mean value and a bitmask indicating the non-zero values may be transferred.

```
                                                        Descriptor
    scaled_binary_quant_payload ( ) {
      mean_value                                        flt(32)
      bit_mask_size                                     u(32)
      for (i=0; i < bit_mask_size; i++)
    {
        Bitmask_values[i]                               u(1)
      }
      byte_alignment( )
    }
```

The bitmask may be further encoded using some suitable compression mechanism such as RLE, golomb, golomb rice, position encoding or a combination of the techniques.

single_scale_ternary_quant_payload ( ): A single scale ternary quantization algorithm produces one scale value that reflects the amount of weight update and a mask that indicates the direction of change, which may be positive, negative or no change. The semantics for single scale ternary quantization of weight updates may be a bitmask and a mean value. In an example approach, both positive and negative directions, zero locations, and one mean of non-zeros for both directions may be encoded. The example is described in the table below, where two bits are used to indicate direction.

```
                                                        Descriptor
  single_scale_ternary_quant_payload ( ) {
    mean_value                                          flt(32)
    bit_mask_size                                       u(32)
    for (i=0; i < bit_mask_size; i++) {
      Bitmask_values[i]                                 u(2)
    }
    byte_alignment( )
  }
```

double_scale_ternary_qauant_payload( ): A double scale ternary quantization is an algorithm that produces scale values in both positive and negative direction. In other words, we communicate two mean_values. For such a method the payload may be similar or substantially similar to single_scale_ternary_quant_payload( )' but two mean values are communicated. Following may be an example implementation:

```
                                                        Descriptor
  single_scale_ternary_quant_payload ( ) {
    mean_value_positive                                 flt(32)
    mean_value_negative                                 flt(32)
    bit_mask_size                                       u(32)
    for (i=0; i < bit_mask_size; i++) {
      Bitmask_values[i]                                 u(2)
    }
    byte_alignment( )
  }
```

Alternatively, instead of a 2-bit bitmask_value, the syntax may include the following:

```
  for(i=0; i < num_weight_updates; i++) {
      bitmask_nonzero_flag[i]                           u(1)
      if(bitmask_nonzero_flag[i])
        bitmask_sign_flag[i]                            u(1)
  }
```

The semantics may be specified as follows:

| bitmask_nonzero_flag | bitmask_sign_flag | meaning |
|---|---|---|
| 0 | not present | the weight update is zero |
| 1 | 1 | there is a weight update in positive direction |
| 1 | 0 | there is a weight update in negative direction |

global_codebook_quant_payload( ): the global codebook quantization mode allows signalling an index corresponding to the values of a partition. In this approach a list of indexes is communicated. The possible design may include following items:

number_of_indices: the total number of indices list_of_indexes: the indexes to the codebook elements of the quantization codebook In an embodiment, such a global codebook may operate on a chunk of data rather than each weight update element. An example design for a channel-wise partition with maximum 2048 channels and a codebook of size 256 may be as following:

```
                                                        Descriptor
  Global_codebook_quant_payload( ){
    number_of_indices                                   u(11)
  for (i = 0; < number_of_indices; i++) {
      List_of_indexes[i]                                u(8)
  }
```

The global codebook may be further compressed using an entropy coding approach to gain further compression.

In yet another embodiment, as the number of partitions in each neural network may be different, the descriptor size may be gated to dynamically adjust the size of the codebook payload. The same may apply to the descriptor size of the list of indexes.

In another embodiment, for ternary family of quantization techniques, two bitmasks may be encoded instead of a two-bit bitmask.

In another embodiment, for the family of scaled quantization techniques, the scales may be further compressed using some other quantization technique, e.g., a uniform quantization with the scale step agreed only once. This further allows reducing the number of bits for representing the scales. Other quantization techniques are possible, e.g., when multiple scales exist for one tensor or in an aggregated mode where all the scales of all the tensors are put together. In another embodiment, only an update to the scale(s) is signalled, such as the difference between the previously-signaled scale(s) and the current scale(s).

Encoding/Decoding of Bitmasks

In an embodiment, a portion of the quantization algorithms for weight update compression, for example, an essential portion may be signalled as bitmask. To further compress the bitmasks, encoding may be performed on bitmasks. In the case of weight-update compression, the bitmasks may be representing binary or ternary representations depending on the quantization algorithm. Such bitmasks may be encoded in several ways to further obtain compressibility. A proper encoding and decoding mechanism may be invoked at the encoder and decoder to interpret the bitmask. Some possibilities may include:

Run-Length encoding: in some example cases, the bitmasks may be highly sparse, in such examples, run-length encoding variants may be applied to further compress the bitmasks. For example, the following table depicts a run_len encoded payload for a bitmask:

| | Descriptor |
|---|---|
| run_len_encoded_payload( ) { | |
| run_size | u(7) or u(8) |
| for (i = 0; I < run_size; i++) { | |
| run_value[i] | u(1) |
| run_length[i] | u(7) |
| } | |
| } | |
| byte_alignment( ) | |
| } | |

In yet another embodiment, an average length of the runs may be estimated, and this may be used to determine the number of bits for run_size using log 2(average_run_legnth), where log 2 is the logarithm in basis 2. In this embodiment, a length of the descriptor may be signalled or a bit width of the run_size and run_length descriptors may be adjusted by using a gating mechanism.

In the decoder side, the run-length encoded data may be parsed and decoded according to the encoding convention to populate a decompressed bitmask.

Alternatively, a count of consecutive zeros between each pair of bits equal to 1 may be coded, by using the following example syntax:

| | Descriptor |
|---|---|
| rle_encoded_data( ) | |
| size_run_flag | u(1) |
| count_runs | u(7+size_rung_lag*8) |
| for (i=0; i < count_runs; i++) { | u(7+size_rung_lag*8) |
| run_length[i] | |
| } | |

run_length: represents the number of times the value of 0 is repeated before the next value of 1.

Position/length-encoding: The bitmasks may be further compressed by signalling the length between 0 s or 1 s. In such an example, a bit mask may be converted to a list of integers indicating the location 1 s or 0 s depending on which number is more populated in the bitmask. This may be similar to run-length but since there is only two run_values, a chosen convention may be signalled once.

run_convention: may signal whether the length-encoding is signalling the number of zeros between ones or the number of ones between zeros.

The length encoded stream may be further compressed either using entropy coding, e.g., CABAC-based approaches or some other mechanism, e.g., golomb encoding.

GOLOMB Encoded Payload

A bitmask may be encoded using Golomb encoding. Following table provides an example of the semantics of the payload:

| | Descriptor |
|---|---|
| Golomb_encoded_payload( ) { | |
| encoded_stream_size | u(16) |
| for (i = 0; I < encoded_stream_size; i++) { | |
| golomb_encoded_bit[i] | u(1) |
| } | |
| byte_alignment( ) | |
| } | |

The length of the descriptors is provided as an example and longer or shorter length may be used.

encoded_stream_size: indicates the total number of bits representing a bitmask after being encoded using Golomb encoding.

golomb_encoded_bit: indicates the bit value of the encoded bitmask.

Encoding of golomb encoded data: The operation of obtaining a golomb encoded data stream may need agreement on a convention. For example, during encoding, by adopting an exp-golomb encoding, the process may be defined as processing each byte of the bitmask as an integer and encode it using the ue(k) definition of NNR spec text as unsigned integer k-th order exp-golomb to generated the golomb_encoded stream.

Decoding of golomb encoded data: is used when the decoding procedure is invoked to reconstruct the original bitmask. For example, each byte of the stream is first decoded using ue(k) decoding procedure and the bytes are put together in order to reconstruct the original bitmask. For a one byte definition k=8, other k values may be possible. In yet another embodiment, other golomb-based encoding procedures may applied, e.g., RLE-golomb, golomb-rice, and the like.

The golomb encoded bitstream may be complemented with some extra bits, e.g., one bit to indicate the sign of the mean value, when extra information is required.

The golomb encoding, e.g., the exponential, may apply to a position encoded bitmasks or other type of payloads obtained from a quantization scheme.

Topology Element Referencing

While referencing topology elements, unique identifiers may be used. These unique identifiers may be indexes that map to a list of topology elements. In order to signal such elements, a new topology payload identifier may be used. As an example, NNR_TPL_REFLIST may be used as a name of such an identifier that maps to a topology storage format value in the NNR topology payload unit or header. It should be noted that in the examples described below, descriptor types are given as examples, and any fixed length or variable length data type may be utilized.

nnr_topology_unit_payload may be extended as follows:

```
                                                          Descriptor
nnr_topology_unit_payload( ) {
  if( topology_storage_format = = NNR_TPL_PRUN )
    nnr_pruning_topology_container( )
  else if (topology_storage_format ==
NNR_TPL_REFLIST)
    topology_elements_ids_list(0)
  else
    topology_data                                         bs(v)
}
```

In another embodiment, topology_data may be used together with the topology_elements_ids_list(0), rather than being mutually exclusive.

topology_elements_ids_list (flag) may store the topology elements or topology element indexes. Flag value may set the mode of operation. For example, if the flag is 0, unique topology element identifiers may be listed. When the flag is 1, unique indexes of the topology elements which are stored in the payload with the type NNR_TPL_REFLIST may be listed. Each index may indicate the order or presence of the topology element in the indicated topology payload.

```
                                                          Descriptor
topology_elements_ids_list(flag) {
  count_topology_elements_minus2                          u(8)
  for(j = 0; j < count_topology_elements_minus2 + 2; j++ ) {
    if (flag == 0) {
      topology_elem_id_list[j]                            st(v)
    }
    else {
      topology_elem_id_index_list[j]                      u(8)
    }
  }
}
```

topology_elem_id_index_list may specify a list of unique indexes related to the topology elements listed in topology information with payload type NNR_TPL_REFLIST. The first element in the topology may have the index value of 0.

Selection of the mode of topology element referencing may be signaled in the NNR model parameter set, with a flag. Suh a flag may be named as mps_topology_indexed_reference_flag and the following syntax elements may be included in the NNR model parameter set:

```
    mps__topology__indexed__reference__flag               u(1)
    nnr__reserved__zero__7bits                            u(7)
```

mps_topology_indexed_reference_flag may specify whether topology elements are referenced by unique index. When set to 1, topology elements may be represented by their indexes in the topology data defined by the topology payload of type NNR_PTL_REFLIST. This flag may be set to 0 when topology information is obtained via topology_data syntax element of NNR topology unit.

In order to store topology element identifiers, NNR compressed data unit header syntax may be extended as follows:

```
                                                          Descriptor
nnr_compressed_data_unit_header( ) {
  nnr_compressed_data_unit_payload_type                   u(5)
  nnr_multiple_topology_elements_present_flag             u(1)
```

-continued

```
                                                          Descriptor
  nnr_decompressed_data_format_present_flag               u(1)
  input_parameters_present_flag                           u(1)
  if(nnr_multiple_topology_elements_present_flag == 1)
  topology_elements_ids_list(mps_topology_indexed_
  reference_flag)
  else {
    if (!mps_topology_indexed_reference_flag)
      topology_elem_id                                    st(v)
    else
      topology_elem_id_index                              u(8)
  }
  if( nnr_compressed_data_unit_payload_type == NNR_PT_
FLOAT ||
      nnr_compressed_data_unit_payload_type ==
NNR_PT_BLOCK) {
    codebook_present_flag                                 u(1)
    if( codebook_present_flag )
      integer_codebook( CbZeroOffset, Codebook )
  }
  if( nnr_compressed_data_unit_payload_type = = NNR_PT_
  INT ||
      nnr_compressed_data_unit_payload_type = =
NNR_PT_FLOAT ||
      nnr_compressed_data_unit_payload_type = =
NNR_PT_BLOCK)
    dq_flag                                               u(1)
  if(nnr_decompressed_data_format_present_flag == 1)
    nnr_decompressed_data_format                          u(7)
  if(input_parameters_present_flag == 1) {
    tensor_dimensions_flag                                u(1)
    cabac_unary_length_flag                               u(1)
    compressed_parameter_types                            u(4)
    if((compressed_parameter_types & NNR_CPT_DC) !=
    0){
      decomposition_rank                                  ue(3)
      g_number_of_rows                                    ue(3)
    }
    if(tensor_dimensions_flag == 1)
      tensor_dimension_list( )
    if (nnr_compressed_data_unit_payload_type !=
NNR_PT_BLOCK)
      if(nnr_multiple_topology_elements_present_flag == 1)
        topology_tensor_dimension_mapping( )
    if(cabac_unary_length_flag == 1)
      cabac_unary_length                                  u(8)
  }
  if( nnr_compressed_data_unit_payload_type = =
NNR_PT_BLOCK &&
      (compressed_parameter_types & NNR_CPT_DC) != 0
      && codebook_present_flag )
    integer_codebook( CbZeroOffsetDC, CodebookDC )
  if( count_tensor_dimensions > 1) {
    scan_order                                            u(4)
    if( scan_order > 0 ) {
      for( j=0; j < NumBlockRowsMinus1; j++ ) {
        cabac_offset_list[j]                              u(8)
        if( dq_flag )
          dq_state_list[j]                                u(3)
        if( j == 0 ) {
          bit_offset_delta1                               ue(11)
          BitOffsetList[j] = bit_offset_delta1
        } else {
          bit_offset_delta2                               ie(7)
          BitOffsetList[j] = BitOffsetList[j−1] +
bit_offset_delta2
        }
      }
    }
  }
  byte_alignment( )
}
```

topology_elem_id_index may specify a unique index value of a topology element which is signaled in topology information of payload type NNR_TPL_REFLIST. The first index may be 0 (e.g. 0-indexed).

element_id_index may specify a unique index that is used to reference a topology element.

Nnr_pruning_topology_container( ) may be extended to support index based topology element referencing as follows:

| | Descriptor |
|---|---|
| nnr_pruning_topology_container( ) { | |
| **nnr_rep_type** | u(2) |
| **prune_flag** | u(1) |
| **order_flag** | u(1) |
| **sparse_flag** | u(1) |
| **nnr_reserved_zero_3bits** | u(3) |
| if (prune_flag == 1) { | |
| if (nnr_rep_type && NNR_TPL_BMSK) | |
| bit_mask( ) | |
| else if (nnr_rep_type && NNR_TPL_DICT) { | |
| **count_ids** | u(8) |
| for (j = 0; j < count_ids; j ++) { | |
| if (!mps_topology_indexed_reference_flag) | |
| **element_id**[j] | st(v) |
| else | |
| **element_id_index**[j] | u(8) |
| } | |
| for (j = 0; j < count_ids; j ++) { | |
| **count_dims**[j] | ue(1) |
| for(k = 0; k < count_dims; k++){ | |
| **dim**[j][k] | ue(7) |
| } | |
| } | |
| byte_alignment( ) | |
| } | |
| } | |
| if (sparse_flag == 1) { | |
| bit_mask( ) | |
| } | |
| } | |

element_id_index may specify a unique index that is used to reference a topology element.

Any topology element referencing can be done either as a unique id or an index referencing.

Signaling Topology Changes

Topology_element_id: is a unique identifier that may define an element of topology. The naming of the topology_element_id may include an execution order to determine the relation of one topology_element_id to other topology_element_ids.

Execution order: each element in topology element may include an order of execution that allows the execution and inference of the NN inference. The execution order may be gated to allow a pre-determined sequence of executions, e.g., a plane feed-forward execution.

Execution_list: may contain a list of topology_element_id to be executed as a sequence after each other.

The existing nnr_prune_topology_container( ) explained in may be used to signal the changes in topology caused by a pruning algorithm for NNR compression. In this example, topology changes due to the change in a task or during weight update compression may be required to be signaled.

In one embodiment, once the incremental_weight_update_flag is set to a value indicating weight update mode of operation the same nnr_prune_topology_container( ) approach may be used to signal the changes in the topology.

prune_structure: may signal the information about the type of a structure that may be pruned or neglected during information encoding, the prune structure may refer to a layer, a channel in convolution layer, a row, a column, or a specific block pattern in a matrix. This information may be gated when there is only one type of structure to ignore, which often, may be agreed by using only one encoding/decoding convention.

ignore_structure: may signal whether a specific structure is pruned or dropped, e.g., a layer. For example, having ignore_structure value 1 means a layer is not encoded in the bitstream or a specific block patter is not encoded in the bitstream.

Encoding information with regard to prune_structure and ignore_structure: at the beginning of the encoding some piece of information about the prune_structure is signalled, when the specific structure meets a specific condition, e.g., all the weight values or weight update values of a layer are zero. Then the ignore_structure may be sent at the beginning of each pattern to mention the specific structure is ignored or included.

decoding and reconstruction: after decoding the reconstruction uses the prune_structure and ignore_structure to reconstruct the original data.

In an alternative embodiment, a specific mechanism that requires a new topology container is proposed.

NNR_TPL_WUPD: NNR topology weight update may be defined as a topology storage format to indicate a topology update associated with a weight update.

topologyNecessary payload and decoding procedures may be invoked, when the NNR_TPL_WUPD payload is present in the nnr_topology_unit_payload. The payload corresponding to the NNR_TPL_WUPD may include:

- num_element_ids: represents a number of elements for which a topology modification is signaled.
- element_ids: represents an array of identifiers, where each identifier corresponds to a specific element that may be modified in the topology in consequence of a topology modification.
- weight_tensor_dimension: is a list of lists, where each internal list is a list of new dimensions of the weight vector corresponding to the respective element id in element_ids.
- reorganize_flag: is a flag to indicate when the existing weight vector may be reorganized according to the new dimensions or a corresponding weight vector may be provided via some NNR data payload. The payload may contain a mapping to indicate how a new weight tensor is obtained from the existing weight tensor, when the reorganize flag signals a reorganization.
- weight_mapping: it is a mapping that indicates how an existing weight is mapped to a new topology element in consequence of dimension changes of the element. Such mapping may be a bitmask with specific processing order to indicate which weight are kept at which locations in the new weight tensor. For example, by using a row major matrix processing. The bitmask may be further compressed with some of the previously mentioned bitmask encoding schemes.
- topology_compressed: is used to indicate that the information associated with topology update may be compressed or follows a specific encoding and decoding procedure to be invoked to decode the topology information.

FIG. 9 is an example apparatus 900, which may be implemented in hardware, configured to implement one or more mechanisms for introducing a weight update compression interpretation into the NNR bitstream or define a validation performance set, based on the examples described herein. Some example of the apparatus 900 include, but are not limited to, apparatus 50, client device 604, and apparatus 700. The apparatus 900 comprises a processor 902, at least one non-transitory memory 904 including computer program code 905, wherein the at least one memory 904 and the computer program code 905 are configured to, with the at least one processor 902, cause the apparatus 900 to implement one or more mechanisms for introducing a weight update compression interpretation into the NNR bitstream or define a validation performance set 906, based on the examples described herein.

The apparatus 900 optionally includes a display 908 that may be used to display content during rendering. The apparatus 900 optionally includes one or more network (NW) interfaces (I/F(s)) 180. The NW I/F(s) 910 may be wired and/or wireless and communicate over the Internet/other network(s) via any communication technique. The NW I/F(s) 910 may comprise one or more transmitters and one or more receivers. The N/W I/F(s) 910 may comprise standard well-known components such as an amplifier, filter, frequency-converter, (de)modulator, and encoder/decoder circuitry(ies) and one or more antennas.

The apparatus 900 may be a remote, virtual or cloud apparatus. The apparatus 900 may be either a coder or a decoder, or both a coder and a decoder. The at least one memory 904 may be implemented using any suitable data storage technology, such as semiconductor based memory devices, flash memory, magnetic memory devices and systems, optical memory devices and systems, fixed memory, and removable memory. The at least one memory 904 may comprise a database for storing data. The apparatus 900 need not comprise each of the features mentioned, or may comprise other features as well. The apparatus 900 may correspond to or be another embodiment of the apparatus 50 shown in FIG. 1 and FIG. 2, or any of the apparatuses shown in FIG. 3. The apparatus 900 may correspond to or be another embodiment of the apparatuses shown in FIG. 12, including UE 80, RAN node 170, or network element(s) 190.

Figure 10:
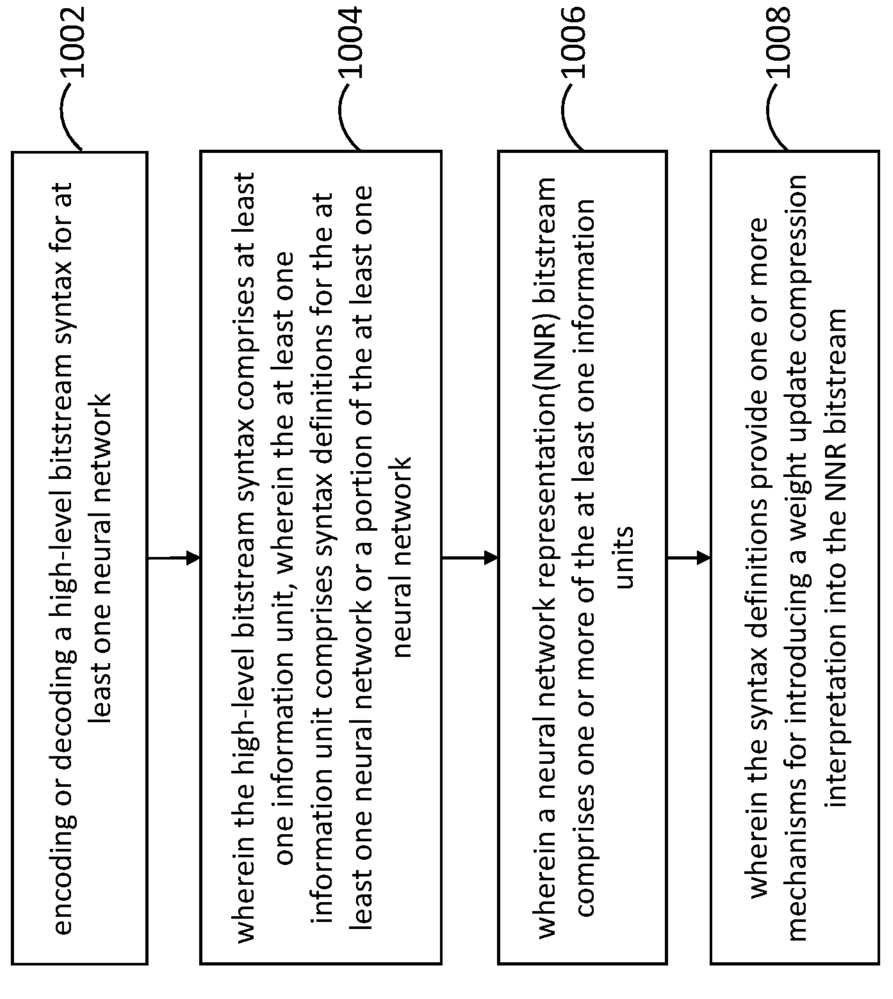
FIG. 10 is an example method for introducing a weight update compression interpretation into the NNR bitstream, in accordance with an embodiment.

FIG. 10 is an example method 1000 for introducing a weight update compression interpretation into the NNR bitstream, in accordance with an embodiment. As shown in block 906 of FIG. 9, the apparatus 900 includes means, such as the processing circuitry 902 or the like, for implementing mechanisms for introducing a weight update compression interpretation into the NNR bitstream. At 1002, the method 1000 includes encoding or decoding a high-level bitstream syntax for at least one neural network. At 1004, the method 1000 includes, wherein wherein the high-level bitstream syntax comprises at least one information unit, wherein the at least one information unit comprises syntax definitions for the at least one neural network or a portion of the at least one neural network. At 1006, the method 1000 includes, wherein a neural network representation (NNR) bitstream comprises one or more of the at least one information units. At 1008, the method 1000 includes, wherein the syntax definitions provide one or more mechanisms for introducing a weight update compression interpretation into the NNR bitstream.

In an embodiment, the one or more mechanisms may include at least one of a mechanism to signal an incremental weight update compression mode of operation, a mechanism to introduce a weight update unit type among the at least one information unit, a mechanism to signal mechanisms required for dithering algorithms, a mechanism to signal a global random seed, a mechanism to signal whether a model comprises an inference friendly quantized model, a mechanism to signal incremental weight update quantization algorithms, a mechanism to signal federated averaging weight update algorithm, a mechanism to signal supporting downstream compression support, a mechanism to signal an asynchronous incremental weight update mode, a mechanism to identify a source of information, a mechanism to identify an operation, a mechanism to define global codebook approaches for a weight update quantization, a mechanism to define extension to one or more data payload types, a mechanism to define extension to a payload, a mechanism to define a syntax and semantics of one or more quantization algorithms, a mechanism to identify encoding and decoding procedures of bitmask applicable to quantization algorithm outputs, or a mechanism to identify a syntax and semantics relevant to a topology change.

Figure 11:
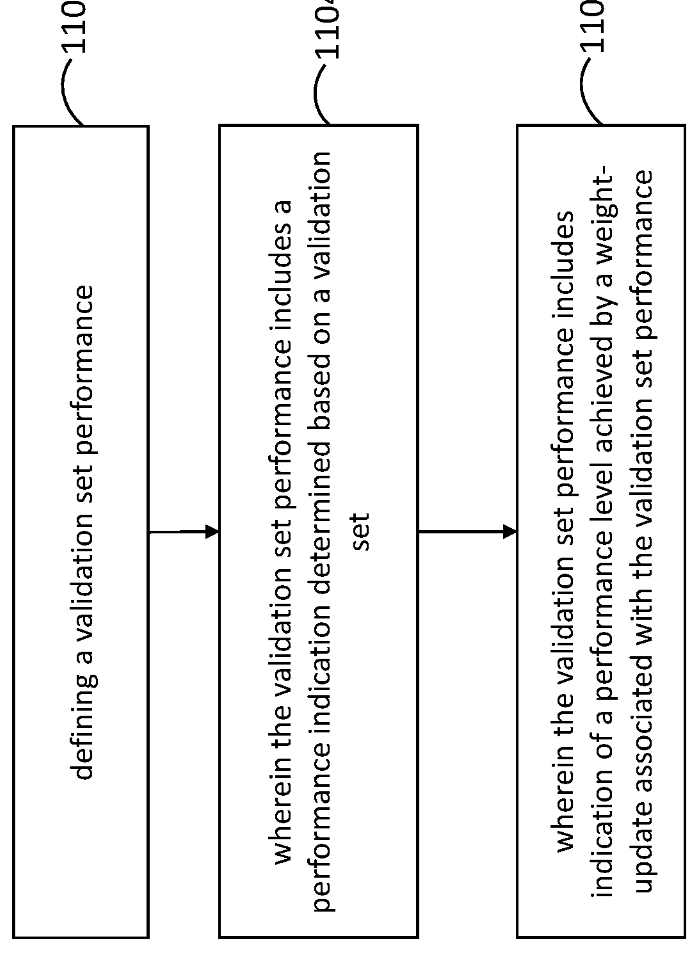
FIG. 11 is an example method 1100 for defining a validation set performance, in accordance with an embodiment.

FIG. 11 is an example method 1100 for defining a validation set performance, in accordance with an embodiment. As shown in block 906 of FIG. 9, the apparatus 900 includes means, such as the processing circuitry 902 or the like, for a validation set performance. At 1102, the method 1100 includes define a validation set performance. wherein the validation set performance comprises or specifies one or more of the following. At 1104, the method 1100 includes, wherein the validation set performance includes a performance indication determined based on a validation set. Additionally or alternatively, at 1106, the method 1100 includes, wherein the validation set performance includes indication of a performance level achieved by a weight-update associated with the validation set performance.

In an embodiment, the validation set performance provides information on how to use the weight-update received from a device. In an example, the weight-updates are multiplied by multiplier values derived from the validation set performance values received from the device.

In an embodiment, the method 1100 may also include defining a weight reference ID, where the weight reference ID uniquely identifies weights for a base model.

In an embodiment, the method 1100 may also include defining a source ID, where the source ID uniquely identifies a source of information.

Figure 12:
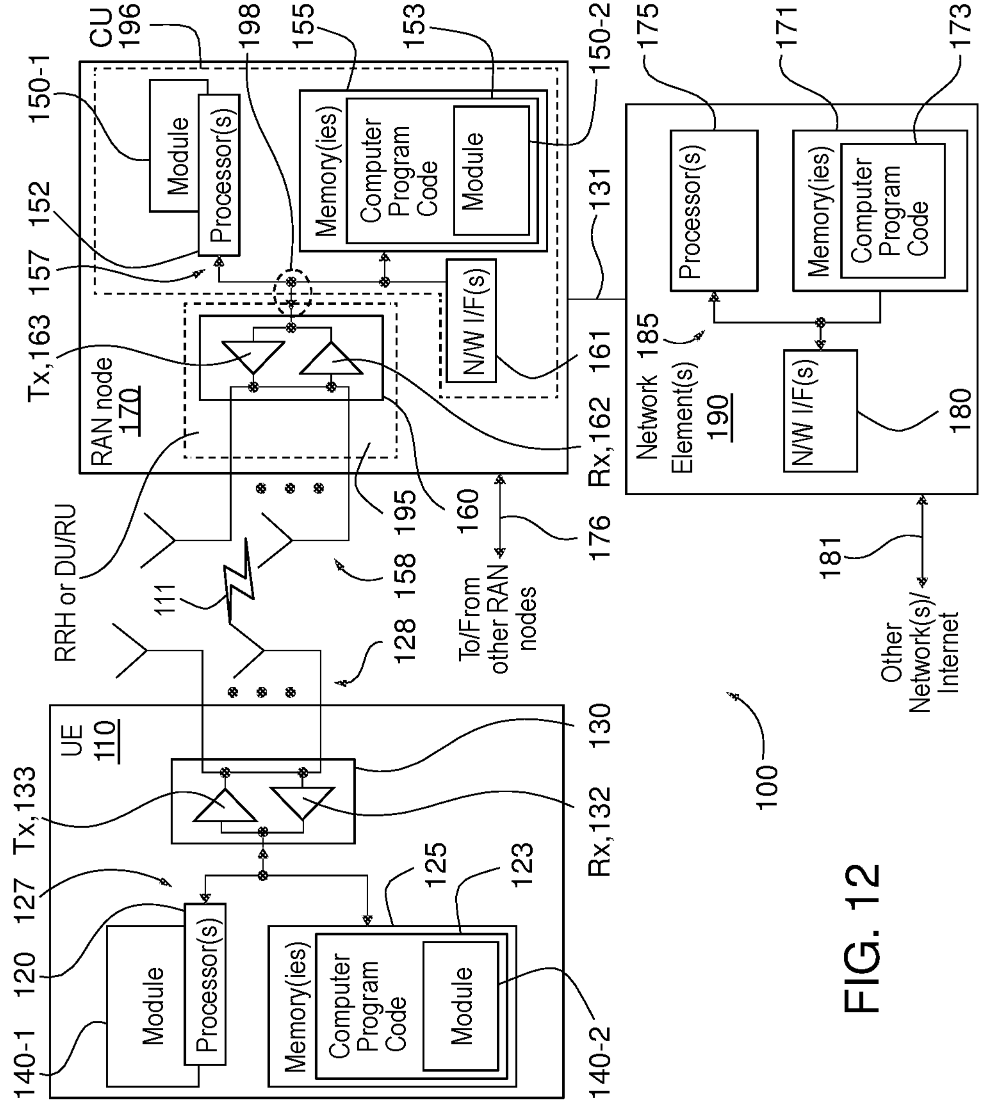
FIG. 12 is a block diagram of one possible and non-limiting system in which the example embodiments may be practiced.

Turning to FIG. 12, this figure shows a block diagram of one possible and non-limiting example in which the examples may be practiced. A user equipment (UE) 110, radio access network (RAN) node 170, and network element(s) 190 are illustrated. In the example of FIG. 1, the user equipment (UE) 110 is in wireless communication with a wireless network 100. A UE is a wireless device that can access the wireless network 100. The UE 110 includes one or more processors 120, one or more memories 125, and one or more transceivers 130 interconnected through one or more buses 127. Each of the one or more transceivers 130 includes a receiver, Rx, 132 and a transmitter, Tx, 133. The one or more buses 127 may be address, data, or control buses, and may include any interconnection mechanism, such as a series of lines on a motherboard or integrated circuit, fiber optics or other optical communication equipment, and the like. The one or more transceivers 130 are connected to one or more antennas 128. The one or more memories 125 include computer program code 123. The UE 110 includes a module 140, comprising one of or both parts 140-1 and/or 140-2, which may be implemented in a number of ways. The module 140 may be implemented in hardware as module 140-1, such as being implemented as part of the one or more processors 120. The module 140-1 may be implemented also as an integrated circuit or through other hardware such as a programmable gate array. In another example, the module 140 may be implemented as module 140-2, which is implemented as computer program code 123 and is executed by the one or more processors 120. For instance, the one or more memories 125 and the computer program code 123 may be configured to, with the one or more processors 120, cause the user equipment 110 to perform one or more of the operations as described herein. The UE 110 communicates with RAN node 170 via a wireless link 111.

The RAN node 170 in this example is a base station that provides access by wireless devices such as the UE 110 to the wireless network 100. The RAN node 170 may be, for example, a base station for 5G, also called New Radio (NR). In 5G, the RAN node 170 may be a NG-RAN node, which is defined as either a gNB or an ng-eNB. A gNB is a node providing NR user plane and control plane protocol terminations towards the UE, and connected via the NG interface to a 5GC (such as, for example, the network element(s) 190). The ng-eNB is a node providing E-UTRA user plane and control plane protocol terminations towards the UE, and connected via the NG interface to the 5GC. The NG-RAN node may include multiple gNBs, which may also include a central unit (CU) (gNB-CU) 196 and distributed unit(s) (DUs) (gNB-DUs), of which DU 195 is shown. Note that the DU may include or be coupled to and control a radio unit (RU). The gNB-CU is a logical node hosting radio resource control (RRC), SDAP and PDCP protocols of the gNB or RRC and PDCP protocols of the en-gNB that controls the operation of one or more gNB-DUs. The gNB-CU terminates the F1 interface connected with the gNB-DU. The F1 interface is illustrated as reference 198, although reference 198 also illustrates a link between remote elements of the RAN node 170 and centralized elements of the RAN node 170, such as between the gNB-CU 196 and the gNB-DU 195. The gNB-DU is a logical node hosting RLC, MAC and PHY layers of the gNB or en-gNB, and its operation is partly controlled by gNB-CU. One gNB-CU supports one or multiple cells. One cell is supported by only one gNB-DU. The gNB-DU terminates the F1 interface 198 connected with the gNB-CU. Note that the DU 195 is considered to include the transceiver 160, for example, as part of a RU, but some examples of this may have the transceiver 160 as part of a separate RU, for example, under control of and connected to the DU 195. The RAN node 170 may also be an eNB (evolved NodeB) base station, for LTE (long term evolution), or any other suitable base station or node.

The RAN node 170 includes one or more processors 152, one or more memories 155, one or more network interfaces (N/W I/F(s)) 161, and one or more transceivers 160 interconnected through one or more buses 157. Each of the one or more transceivers 160 includes a receiver, Rx, 162 and a transmitter, Tx, 163. The one or more transceivers 160 are connected to one or more antennas 158. The one or more memories 155 include computer program code 153. The CU 196 may include the processor(s) 152, memories 155, and network interfaces 161. Note that the DU 195 may also contain its own memory/memories and processor(s), and/or other hardware, but these are not shown.

The RAN node 170 includes a module 150, comprising one of or both parts 150-1 and/or 150-2, which may be implemented in a number of ways. The module 150 may be implemented in hardware as module 150-1, such as being implemented as part of the one or more processors 152. The module 150-1 may be implemented also as an integrated circuit or through other hardware such as a programmable gate array. In another example, the module 150 may be implemented as module 150-2, which is implemented as computer program code 153 and is executed by the one or more processors 152. For instance, the one or more memories 155 and the computer program code 153 are configured to, with the one or more processors 152, cause the RAN node 170 to perform one or more of the operations as described herein. Note that the functionality of the module 150 may be distributed, such as being distributed between the DU 195 and the CU 196, or be implemented solely in the DU 195.

The one or more network interfaces 161 communicate over a network such as via the links 176 and 131. Two or more gNBs 170 may communicate using, for example, link 176. The link 176 may be wired or wireless or both and may implement, for example, an Xn interface for 5G, an X2 interface for LTE, or other suitable interface for other standards.

The one or more buses 157 may be address, data, or control buses, and may include any interconnection mechanism, such as a series of lines on a motherboard or integrated circuit, fiber optics or other optical communication equipment, wireless channels, and the like. For example, the one or more transceivers 160 may be implemented as a remote radio head (RRH) 195 for LTE or a distributed unit (DU) 195 for gNB implementation for 5G, with the other elements of the RAN node 170 possibly being physically in a different location from the RRH/DU, and the one or more buses 157 may be implemented in part as, for example, fiber optic cable or other suitable network connection to connect the other elements (for example, a central unit (CU), gNB-CU) of the RAN node 170 to the RRH/DU 195. Reference 198 also indicates those suitable network link(s).

It is noted that description herein indicates that 'cells' perform functions, but it should be clear that equipment which forms the cell may perform the functions. The cell makes up part of a base station. That is, there can be multiple cells per base station. For example, there may be three cells for a single carrier frequency and associated bandwidth, each cell covering one-third of a 360 degree area so that the single base station's coverage area covers an approximate oval or circle. Furthermore, each cell can correspond to a single carrier and a base station may use multiple carriers. So if there are three 120 degree cells per carrier and two carriers, then the base station has a total of 6 cells.

The wireless network 100 may include a network element or elements 190 that may include core network functionality, and which provides connectivity via a link or links 181 with a further network, such as a telephone network and/or a data communications network (for example, the Internet). Such core network functionality for 5G may include access and mobility management function(s) (AMF(S)) and/or user plane functions (UPF(s)) and/or session management function(s) (SMF(s)). Such core network functionality for LTE may include MME (Mobility Management Entity)/SGW (Serving Gateway) functionality. These are merely example functions that may be supported by the network element(s) 190, and note that both 5G and LTE functions might be supported. The RAN node 170 is coupled via a link 131 to the network element 190. The link 131 may be implemented as, for example, an NG interface for 5G, or an S1 interface for LTE, or other suitable interface for other standards. The network element 190 includes one or more processors 175, one or more memories 171, and one or more network interfaces (N/W I/F(s)) 180, interconnected through one or more buses 185. The one or more memories 171 include computer program code 173. The one or more memories 171 and the computer program code 173 are configured to, with the one or more processors 175, cause the network element 190 to perform one or more operations.

The wireless network 100 may implement network virtualization, which is the process of combining hardware and software network resources and network functionality into a single, software-based administrative entity, a virtual network. Network virtualization involves platform virtualization, often combined with resource virtualization. Network virtualization is categorized as either external, combining many networks, or parts of networks, into a virtual unit, or internal, providing network-like functionality to software containers on a single system. Note that the virtualized entities that result from the network virtualization are still implemented, at some level, using hardware such as processors 152 or 175 and memories 155 and 171, and also such virtualized entities create technical effects.

The computer readable memories 125, 155, and 171 may be of any type suitable to the local technical environment and may be implemented using any suitable data storage technology, such as semiconductor based memory devices, flash memory, magnetic memory devices and systems, optical memory devices and systems, fixed memory and removable memory. The computer readable memories 125, 155, and 171 may be means for performing storage functions. The processors 120, 152, and 175 may be of any type suitable to the local technical environment, and may include one or more of general purpose computers, special purpose computers, microprocessors, digital signal processors (DSPs) and processors based on a multi-core processor architecture, as non-limiting examples. The processors 120, 152, and 175 may be means for performing functions, such as controlling the UE 110, RAN node 170, network element(s) 190, and other functions as described herein.

In general, the various embodiments of the user equipment 110 can include, but are not limited to, cellular telephones such as smart phones, tablets, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, tablets with wireless communication capabilities, as well as portable units or terminals that incorporate combinations of such functions.

One or more of modules 140-1, 140-2, 150-1, and 150-2 may be configured to implement one or more mechanisms for introducing a weight update compression interpretation into the NNR bitstream or define a validation performance set, based on the examples described herein. Computer program code 173 may also be configured to implement one or more mechanisms for introducing a weight update compression interpretation into the NNR bitstream or define a validation performance set, based on the examples described herein.

As described above, FIGS. 10 and 11 include a flowcharts of an apparatus (e.g. 50, 602, 604, 700, or 900), method, and computer program product according to certain example embodiments. It will be understood that each block of the flowcharts, and combinations of blocks in the flowcharts, may be implemented by various means, such as hardware, firmware, processor, circuitry, and/or other devices associated with execution of software including one or more computer program instructions. For example, one or more of the procedures described above may be embodied by computer program instructions. In this regard, the computer program instructions which embody the procedures described above may be stored by a memory (e.g. 58, 125, 704, or 904) of an apparatus employing an embodiment of the present invention and executed by processing circuitry (e.g. 56, 120, 702 or 902) of the apparatus. As will be appreciated, any such computer program instructions may be loaded onto a computer or other programmable apparatus (e.g., hardware) to produce a machine, such that the resulting computer or other programmable apparatus implements the functions specified in the flowchart blocks. These computer program instructions may also be stored in a computer-readable memory that may direct a computer or other programmable apparatus to function in a particular manner, such that the instructions stored in the computer-readable memory produce an article of manufacture, the execution of which implements the function specified in the flowchart blocks. The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowchart blocks.

A computer program product is therefore defined in those instances in which the computer program instructions, such as computer-readable program code portions, are stored by at least one non-transitory computer-readable storage medium with the computer program instructions, such as the computer-readable program code portions, being configured, upon execution, to perform the functions described above, such as in conjunction with the flowchart(s) of FIGS. 10 and 11. In other embodiments, the computer program instructions, such as the computer-readable program code portions, need not be stored or otherwise embodied by a non-transitory computer-readable storage medium, but may, instead, be embodied by a transitory medium with the computer program instructions, such as the computer-readable program code portions, still being configured, upon execution, to perform the functions described above.

Accordingly, blocks of the flowcharts support combinations of means for performing the specified functions and combinations of operations for performing the specified functions for performing the specified functions. It will also be understood that one or more blocks of the flowcharts, and combinations of blocks in the flowcharts, may be implemented by special purpose hardware-based computer systems which perform the specified functions, or combinations of special purpose hardware and computer instructions.

In some embodiments, certain ones of the operations above may be modified or further amplified. Furthermore, in some embodiments, additional optional operations may be included. Modifications, additions, or amplifications to the operations above may be performed in any order and in any combination.

In the above, some embodiments have been described in relation to a particular type of a parameter set (namely adaptation parameter set). It needs to be understood, however, that embodiments may be realized with any type of parameter set or other syntax structure in the bitstream.

In the above, some example embodiments have been described with the help of syntax of the bitstream. It needs to be understood, however, that the corresponding structure and/or computer program may reside at the encoder for generating the bitstream and/or at the decoder for decoding the bitstream.

In the above, where example embodiments have been described with reference to an encoder, it needs to be understood that the resulting bitstream and the decoder have corresponding elements in them. Likewise, where example embodiments have been described with reference to a decoder, it needs to be understood that the encoder has structure and/or computer program for generating the bitstream to be decoded by the decoder.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Accordingly, the description is intended to embrace all such alternatives, modifications and variances which fall within the scope of the appended claims. Although specific terms are employed herein, they are used in a generic and descriptive sense only and not for purposes of limitation.

It should be understood that the foregoing description is only illustrative. Various alternatives and modifications may be devised by those skilled in the art. For example, features recited in the various dependent claims may be combined with each other in any suitable combination(s). In addition, features from different embodiments described above may be selectively combined into a new embodiment. Accordingly, the description is intended to embrace all such alternatives, modifications and variances which fall within the scope of the appended claims.

What is claimed is:

1. An apparatus comprising:

at least one processor; and at least one memory storing instructions that, when executed by the at least one processor, cause the apparatus at least to perform:

defining a validation set performance, wherein the validation set performance comprises or specifies one or more of the following:

a performance indication determined based on a validation set; or indication of a performance level achieved by a weight-update associated with the validation set performance; and indicating, within a data unit header, one or more parameter identifiers that identify one or more parameters of a model that tensors stored in a data unit associated to the data header relate to;

wherein the performance level achieved by the weight update is obtained after the weight update is dequantized and employed into the model.

2. The apparatus of claim 1, wherein the apparatus is further caused to:

determine the performance level based on a validation dataset present at a client side.

3. The apparatus of claim 1, wherein the validation set performance provides information on how to use the weight-update received from a device.

4. The apparatus of claim 3, wherein the apparatus is caused to multiply the weight-update by using multiplier values derived from the validation set performance values received from the device.

5. The apparatus of claim 3, wherein the device comprises a source.

6. The apparatus of claim 3, wherein the device comprises at least one of a client or a server.

7. The apparatus of claim 3, wherein the apparatus comprises the device.

8. The apparatus of claim 1, wherein the apparatus is caused to define a weight reference ID, wherein the weight reference ID uniquely identifies weights for a base model.

9. The apparatus of claim 1, wherein the apparatus is further caused to define a source ID, wherein the source ID uniquely identifies a source of information.

10. The apparatus of claim 9, wherein the source ID comprises a flag, and wherein the source ID is interpreted as a communication direction or as a string identifier for providing detailed information regarding the source.

11. The apparatus of claim 1, wherein the data unit header comprises a neural network representation compressed data unit header, and the data unit comprises a neural network compressed data unit.

12. A method comprising:

defining a validation set performance, wherein the validation set performance comprises or specifies one or more of the following:

a performance indication determined based on a validation set; or indication of a performance level achieved by a weight-update associated with the validation set performance; and indicating, within a data unit header, one or more parameter identifiers that identify one or more parameters of a model that tensors stored in a data unit associated to the data header relate to;

wherein the performance level achieved by the weight update is obtained after the weight update is dequantized and employed into the model.

13. The method of claim 12, further comprising determining the performance level based on a validation dataset present at a client side.

14. The method of claim 12, wherein the validation set performance provides information on how to use the weight-update received from a device.

15. The method of claim 14, further comprising multiplying the weight-update by using multiplier values derived from the validation set performance values received from the device.

16. The method of claim 14, wherein the device comprises: a source, or at least one of a client or a server.

17. The method of claim 14, wherein the apparatus comprises the device.

18. The method of claim 12, further comprising defining a weight reference ID, wherein the weight reference ID uniquely identifies weights for a base model.

19. The method of claim 12, further comprising defining a source ID, wherein the source ID uniquely identifies a source of information, wherein the source ID comprises a flag, and wherein the source ID is interpreted as a communication direction or as a string identifier for providing detailed information regarding the source.

* * * * *